US012775026B2

(12) United States Patent
Maruyama

(10) Patent No.: US 12,775,026 B2
(45) Date of Patent: Oct. 27, 2026

(54) CURRENT DETECTION DEVICE

(71) Applicant: Asahi Kasei Microdevices Corporation, Tokyo (JP)

(72) Inventor: Takehiro Maruyama, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 161 days.

(21) Appl. No.: 18/770,696

(22) Filed: Jul. 12, 2024

(65) Prior Publication Data

US 2025/0020699 A1 Jan. 16, 2025

(30) Foreign Application Priority Data

Jul. 13, 2023 (JP) ................................ 2023-115540
Jul. 12, 2024 (JP) ................................ 2024-112396

(51) Int. Cl.
*G01R 15/20* (2006.01)
*G01R 19/00* (2006.01)

(52) U.S. Cl.
CPC ......... *G01R 15/207* (2013.01); *G01R 15/202* (2013.01); *G01R 19/0092* (2013.01)

(58) Field of Classification Search
CPC ............... G01R 15/207; G01R 15/202; G01R 19/0092; G01R 15/20
USPC ....................................................... 324/76.11
See application file for complete search history.

(56) References Cited

U.S. PATENT DOCUMENTS 6,459,255 B1 10/2002 Tamai
6,512,359 B1 1/2003 Tamai
10,215,780 B2 2/2019 Shimizu
10,267,825 B2 4/2019 Sakaguchi
11,366,141 B1 6/2022 Daubert
11,402,409 B1 8/2022 Mcnally
2007/0279053 A1 12/2007 Taylor
2008/0094060 A1* 4/2008 Muraki ................ G01R 15/207 324/252
2008/0186021 A1* 8/2008 Hashio ................ G01R 15/207 264/254
2010/0045286 A1 2/2010 Hotz
2011/0221430 A1* 9/2011 Ito ........................ G01R 15/207 324/244

(Continued)

FOREIGN PATENT DOCUMENTS

DE 102021119837 A1 2/2023
JP 2002277491 A 9/2002

(Continued)

*Primary Examiner* — Christopher P McAndrew

(57) ABSTRACT

Provided is a current detection device, comprising at least two bus bars each of which includes a magnetic detection element, a first current path having a larger cross-sectional area, and a second current path having a smaller cross-sectional area, the first current path and the second current path sandwiching the magnetic detection element, wherein the at least two bus bars are arranged such that the first current paths face each other. The current detection device may further comprise another bus bar that is arranged between the at least two bus bars, and includes a magnetic detection element, a third current path having a large cross-sectional area, and a fourth current path having a small cross-sectional area, to the third current path and the fourth current path sandwiching the magnetic detection element.

21 Claims, 38 Drawing Sheets

(56) References Cited

U.S. PATENT DOCUMENTS

| | | | | |
|---|---|---|---|---|
| 2013/0187633 | A1* | 7/2013 | Yasui | G01R 15/185 324/117 R |
| 2013/0214593 | A1* | 8/2013 | Ohashi | B60R 16/03 307/10.1 |
| 2013/0320968 | A1* | 12/2013 | Sakamoto | G01R 15/207 324/244 |
| 2014/0097826 | A1 | 4/2014 | Hebiguchi | |
| 2014/0103918 | A1* | 4/2014 | Nomura | G01R 15/205 324/244 |
| 2014/0320122 | A1 | 10/2014 | Fukui | |
| 2015/0123650 | A1 | 5/2015 | Matsue | |
| 2015/0204916 | A1* | 7/2015 | Akimoto | G01R 15/207 702/64 |
| 2015/0204919 | A1* | 7/2015 | Akimoto | G01R 15/207 324/244 |
| 2015/0245534 | A1* | 8/2015 | Seo | G01R 15/207 361/689 |
| 2017/0003323 | A1* | 1/2017 | Nakayama | H02M 7/003 |
| 2017/0082659 | A1* | 3/2017 | Harada | G01R 15/20 |
| 2017/0212153 | A1* | 7/2017 | Tsujimoto | G01R 19/0092 |
| 2017/0343584 | A1 | 11/2017 | Abe | |
| 2018/0306842 | A1 | 10/2018 | Fukunaka | |
| 2019/0187183 | A1* | 6/2019 | Okuyama | G01R 19/0092 |
| 2019/0293733 | A1* | 9/2019 | Esaka | G01R 33/0076 |
| 2020/0011902 | A1 | 1/2020 | Shimizu | |
| 2020/0256897 | A1* | 8/2020 | Fujimori | G01R 15/20 |
| 2021/0080489 | A1 | 3/2021 | Koizumi | |
| 2021/0285794 | A1 | 9/2021 | Briano | |
| 2021/0311136 | A1* | 10/2021 | Augendre | G01R 19/0092 |
| 2022/0091161 | A1 | 3/2022 | Houis | |
| 2022/0163571 | A1 | 5/2022 | Ito | |
| 2023/0092098 | A1 | 3/2023 | Tamura | |

FOREIGN PATENT DOCUMENTS

| | | | |
|---|---|---|---|
| JP | 2005283451 | A | 10/2005 |
| JP | 2008216230 | A | 9/2008 |
| JP | 2013170878 | A | 9/2013 |
| JP | 2014055790 | A | 3/2014 |
| JP | 2016121960 | A | 7/2016 |
| JP | 2018185225 | A | 11/2018 |
| JP | 2022158768 | A | 10/2022 |

* cited by examiner

CURRENT DETECTION DEVICE

BACKGROUND

1. Technical Field

The present invention relates to a current detection device.

2. Related Art

In Patent document 1, "a current sensor that is capable of measuring with high accuracy even if a frequency of to-be-measured current is changed" is disclosed. In Patent document 2, "a current sensor that is capable of reducing the effect of an adjacent current path" is disclosed. In Patent document 3, "a current sensor that can suppress measurement error due to the influence of a current flowing in another conductor that is adjacent to a conductor in which a to be measured current is flowing and can also widen the frequency band in which a current can be measured" is disclosed.

PRIOR ART DOCUMENT

Patent Document

Patent Document 1: Japanese Patent Application Publication No. 2014-055790
Patent Document 2: Japanese Patent Application Publication No. 2013-170878
Patent document 3: PCT International Publication No. WO2016/148022

DESCRIPTION OF EXEMPLARY EMBODIMENTS

The present invention will be described below through embodiments of the invention, but the following embodiments do not limit the invention according to the claims. In addition, not all of the combinations of features described in the embodiments are imperative to the solutions of the invention.

Configuration of First Embodiment

Figure 1:
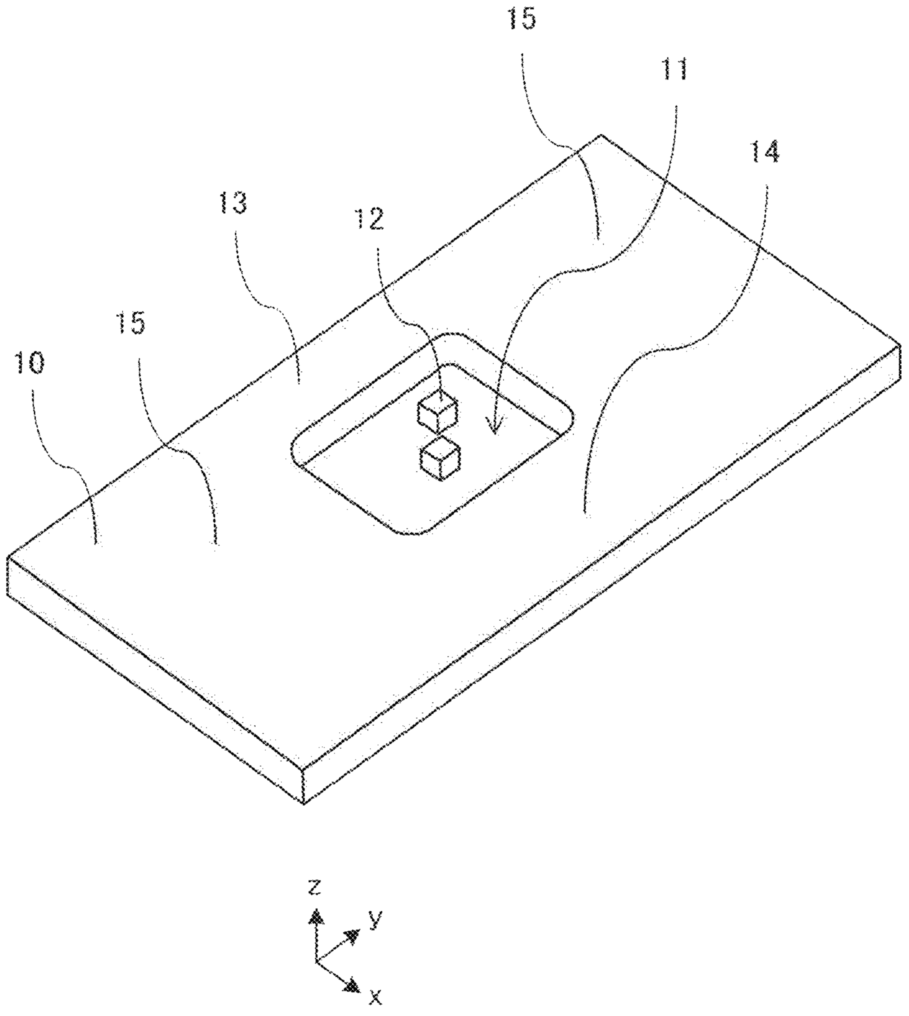
FIG. 1 is a perspective view illustrating an example of a schematic configuration of a current measuring conductor 10 in a first embodiment.
Figure 2:
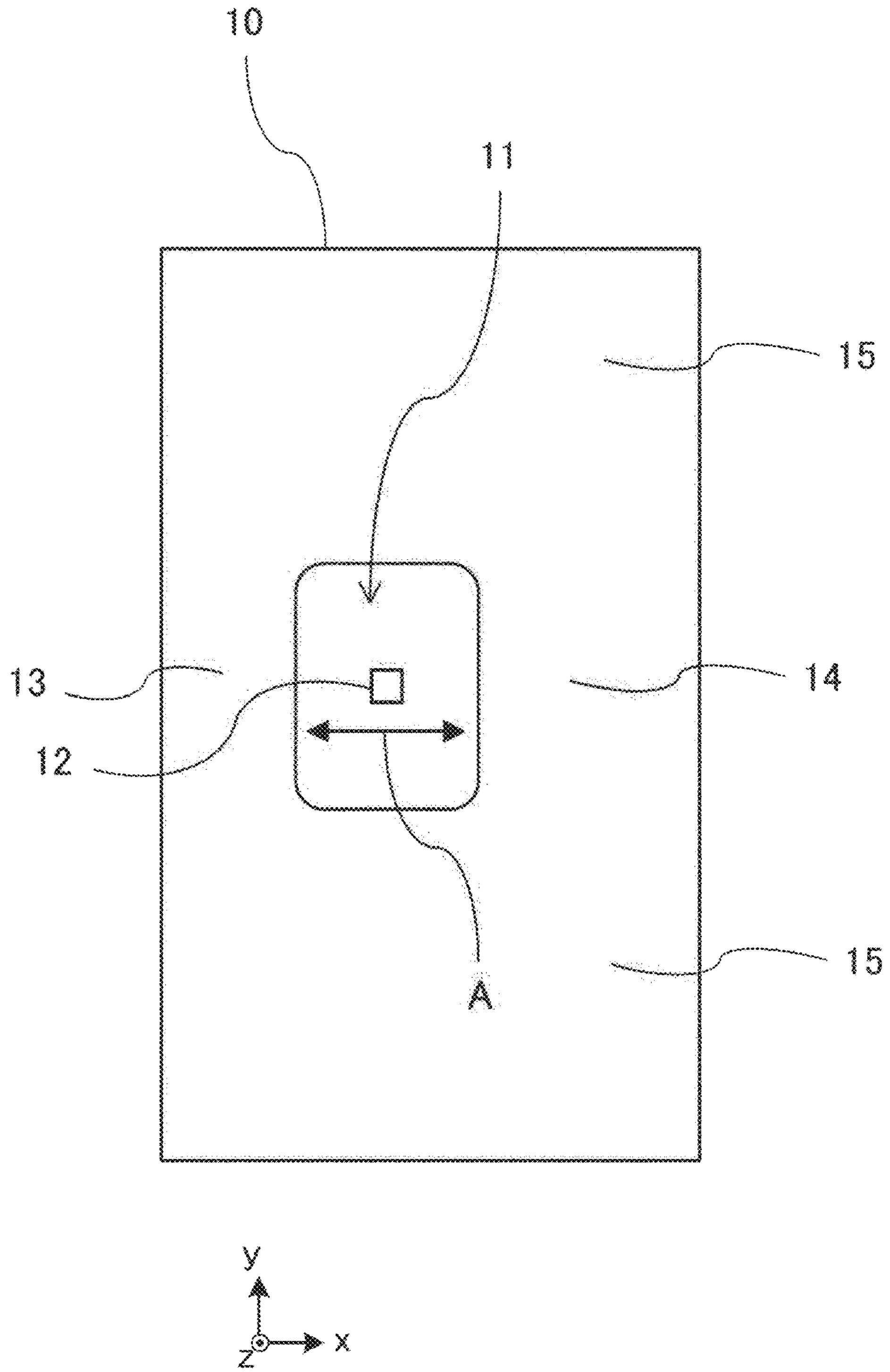
FIG. 2 is a top view illustrating an example of the schematic configuration of the current measuring conductor 10 in the first embodiment.
Figure 3:
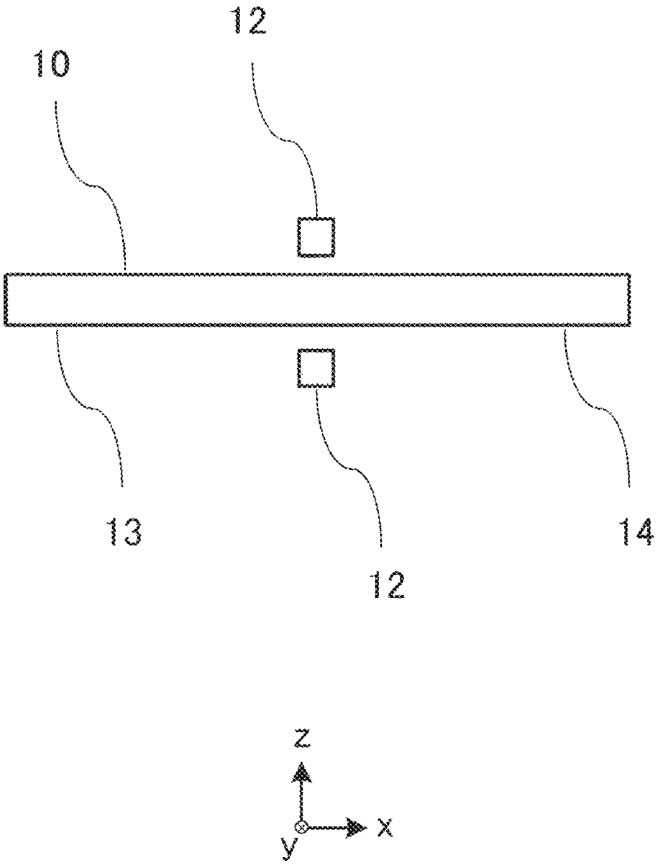
FIG. 3 is a side view illustrating an example of the schematic configuration of the current measuring conductor 10 in the first embodiment.

FIG. 1 is a perspective view illustrating an example of a schematic configuration of a current measuring conductor 10 in a first embodiment. FIG. 2 is a top view illustrating an example of the schematic configuration of the current measuring conductor 10 in the first embodiment. FIG. 3 is a side view illustrating an example of the schematic configuration of the current measuring conductor 10 in the first embodiment. In each drawing, an xyz coordinate system is illustrated. As shown in FIG. 1 to FIG. 3, the current measuring conductor 10 includes a gap 11, two magnetic detection elements 12, two current paths 13 and 14, and two main body portions 15. Note that the current measuring conductor 10 is also called as a bus bar.

As shown in FIG. 1 to FIG. 3, the two current paths 13 and 14 are disposed between the two main body portions 15 and extended in parallel to each other. A gap 11 is disposed between the two current paths 13 and 14. A length of the gap 11 is 8 mm, for example. In each of the two current paths 13 and 14, to-be-measured current is flowing in a same direction. In the present embodiment, the two current paths 13 and 14 are conductors having a transverse cross-sectional shape of rectangular and extending linearly. Note that the transverse cross-sectional shape of the two current paths 13 and 14 may be any shape such as circle or ellipse.

The two current paths 13 and 14 have cross-sectional areas different from each other. In a first embodiment, the two current paths 13 and 14 have a same thickness and different widths. Herein, the width of the current path 13 is less than the width of the current path 14. In the first embodiment, the width of the current path 13 in an x direction is 3.5 mm, and the width of the current path 14 in the x direction is 6.5 mm. In this manner, the current measuring conductor 10 has an asymmetrical shape in the x direction.

In the current measuring conductor 10 illustrated in FIG. 1 to FIG. 3, the two magnetic detection elements 12 are disposed above and below the gap 11 to sandwich the gap 11. The two magnetic detection elements 12 are fixed on the current measuring conductor 10 via a substrate. An arrow A illustrated in FIG. 2 indicates a range of a shift of a position to implement the magnetic detection elements 12 in the current measuring conductor 10. As shown in FIG. 2, the magnetic detection elements 12 may be implemented in a state in which the position is shifted in the x direction by a width of the arrow A.

Each of the magnetic detection elements 12 detects strength of a magnetic field generated on each magnetosensitive surface by the to-be-measured current flowing through each of the two current paths 13 and 14 and outputs a detection signal corresponding to this detected strength. Each of the magnetic detection elements 12 is arranged such that the magnetic fields generated by the to-be-measured current flowing in the same direction through the two current paths 13 and 14, respectively, penetrate through the magnetosensitive surfaces in opposite orientations to each other. That is, the magnetic detection elements 12 are arranged between the two current paths 13 and 14 such that orientations of the magnetosensitive surfaces coincide with each other. In the examples of FIG. 1 to FIG. 3, the orientation of the magnetosensitive surface, that is, the normal direction of the surface is the x direction.

As the magnetic detection elements 12, a magnetoelectric conversion element can be used, and as the magnetoelectric conversion element, for example, a Hall element capable of obtaining a detection signal proportional to a magnitude of a magnetic flux density can be used. Note that as the magnetoelectric conversion element, a magnetoresistive element, a magnetic impedance element or the like may be used alternative to or in addition to the Hall element. Furthermore, any component with which a detection signal is uniquely determined for a magnetic flux density to be applied, such as a magnetic sensor IC obtained by combining these magnetoelectric conversion elements and an IC processing circuit, can be used as the magnetic detection elements 12.

Figure 4:
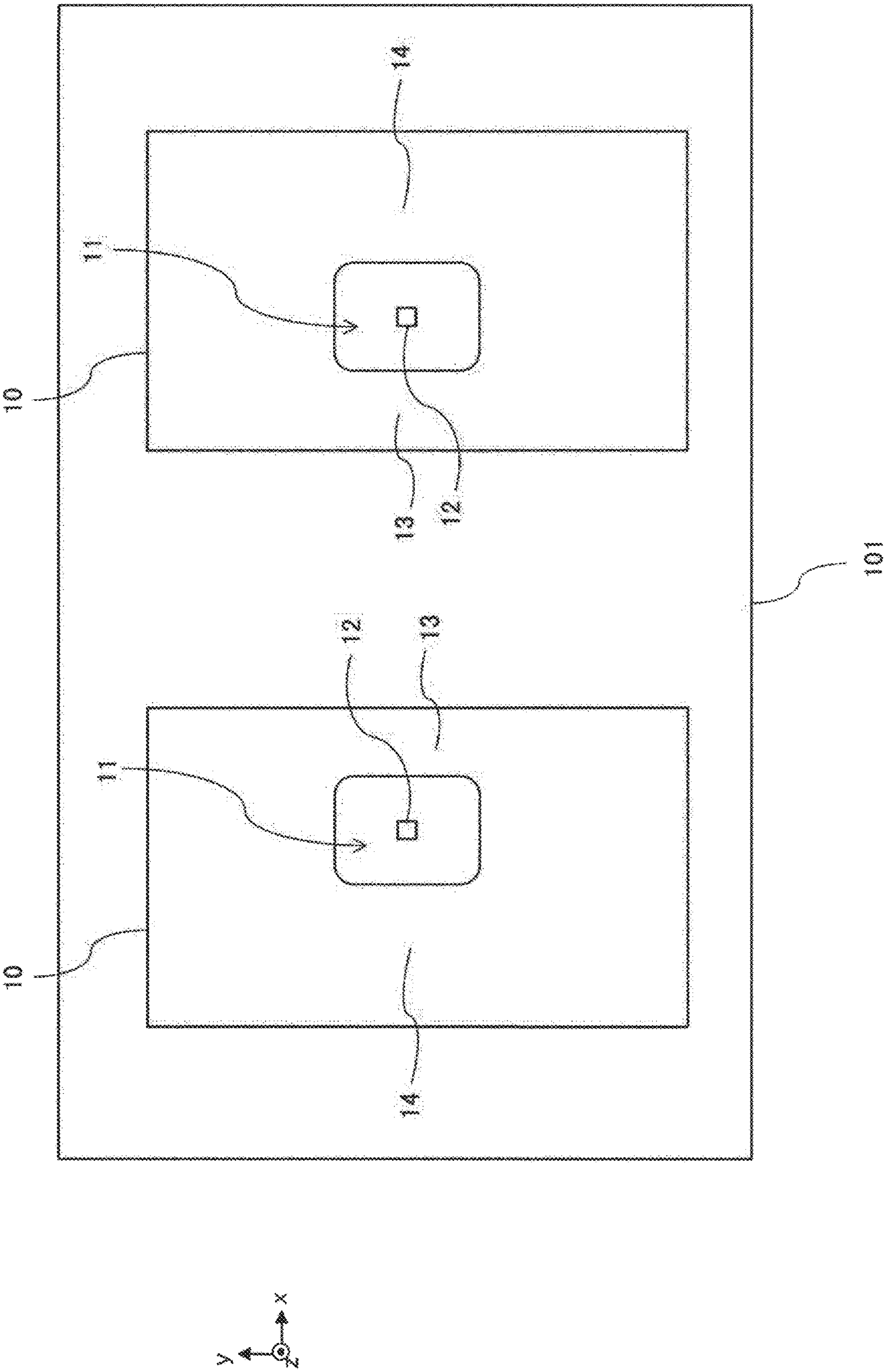
FIG. 4 is a top view illustrating a schematic configuration of a current detection device 101 in a reference example.

FIG. 4 is a top view illustrating a schematic configuration of a current detection device 101 in a reference example. As shown in FIG. 4, the current detection device 101 of the reference example includes two current measuring conductors 10. The two current measuring conductors 10 are arranged side by side in the x direction such that current paths 13 with less widths face each other. It can be also said that, if the current measuring conductors 10 have a same shape as each other, the current measuring conductors 10 are arranged next to each other in the x direction. The two current measuring conductors 10 are arranged to be aligned with each other in a y direction and a z direction.

Figure 5:
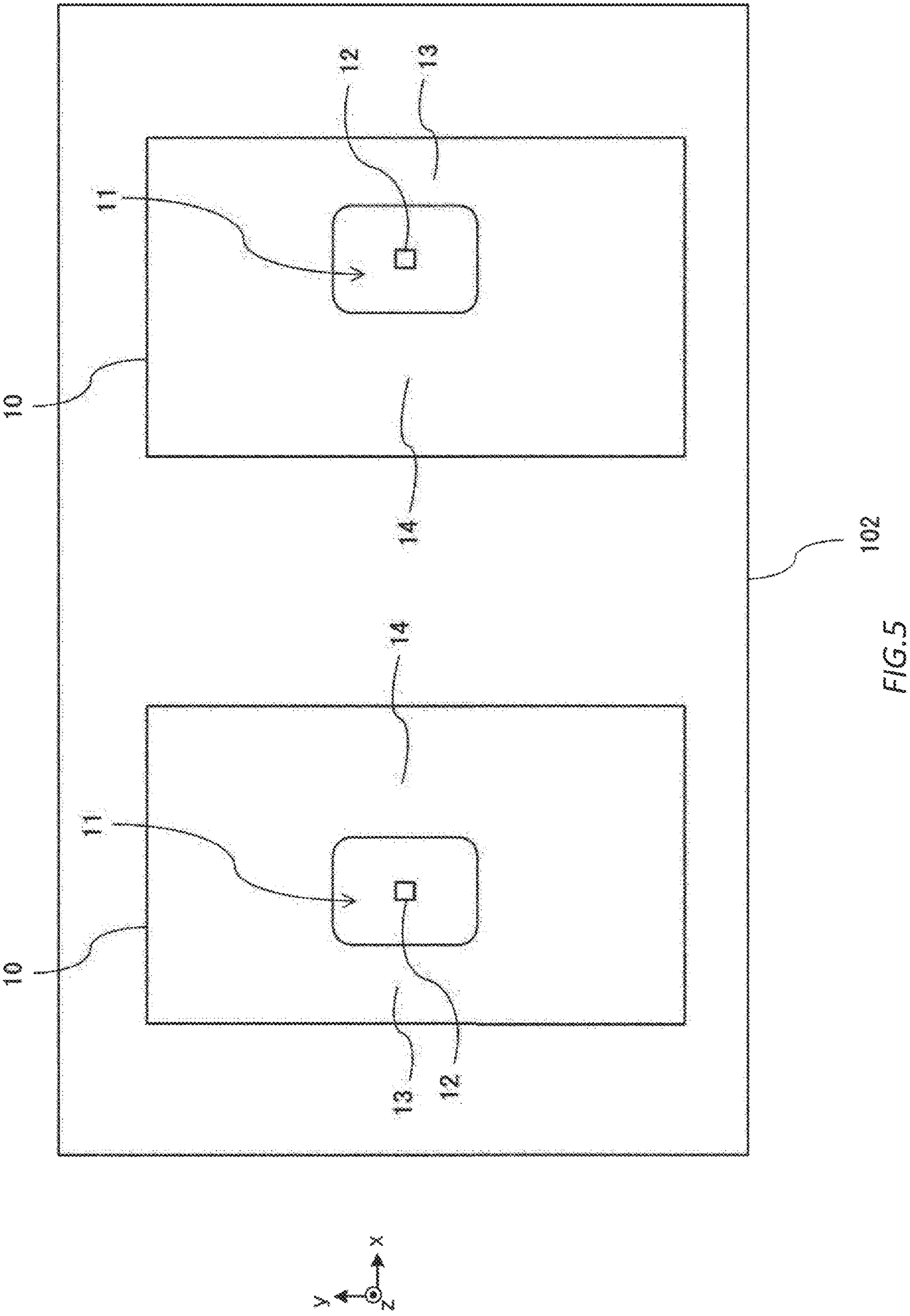
FIG. 5 is a top view illustrating a schematic configuration of a current detection device 102 in the first embodiment.

FIG. 5 is a top view illustrating a schematic configuration of a current detection device 102 in the first embodiment. As shown in FIG. 5, the current detection device 102 of the first embodiment includes two current measuring conductors 10. The two current measuring conductors 10 are arranged side by side in the x direction such that current paths 14 with greater widths face each other.

Figure 6:
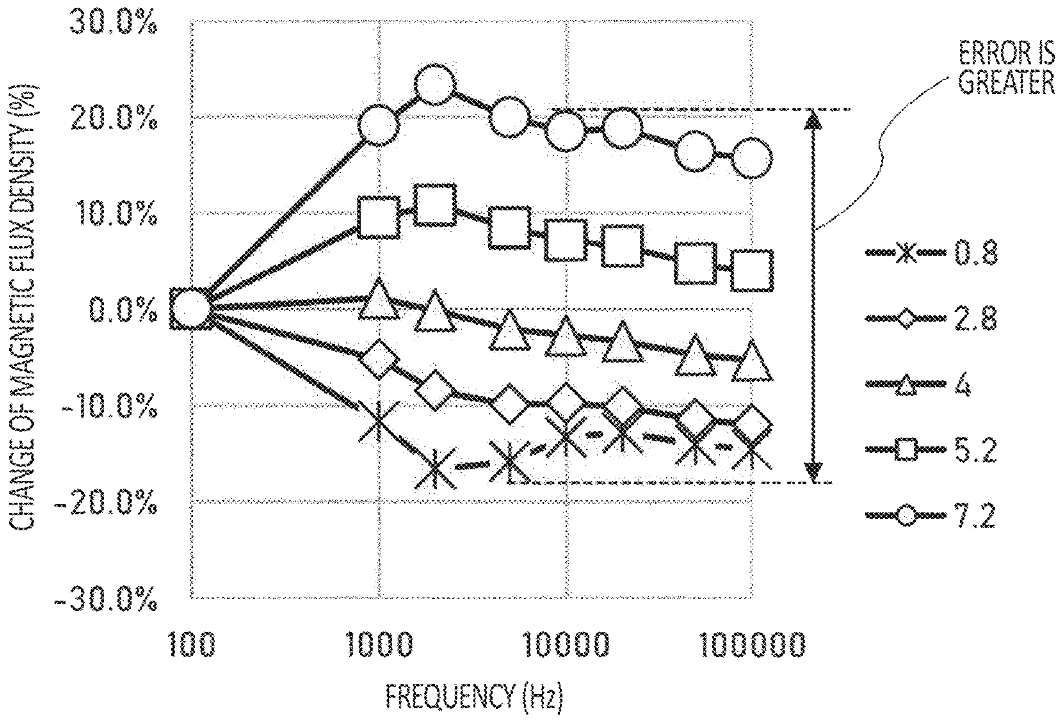
FIG. 6 is a graph illustrating a performance of the current detection device 101 in the reference example.
Figure 7:
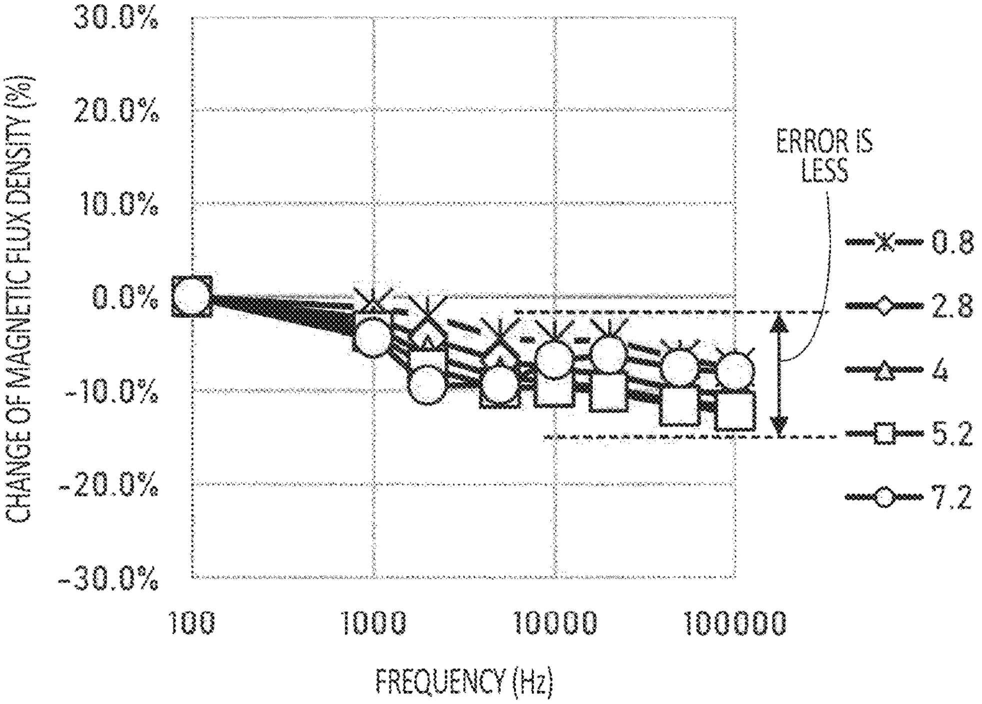
FIG. 7 is a graph illustrating a performance of the current detection device 102 in the first embodiment.

FIG. 6 is a graph illustrating a performance of the current detection device 101 in the reference example, and FIG. 7 is a graph illustrating a performance of the current detection device 102 of the first embodiment. FIG. 6 and FIG. 7 illustrate a change due to a frequency of a magnetic flux density detected by each of the magnetic detection elements 12 in a case in which phases of the alternating currents flowing in two current measuring conductors 10 are shifted from each other by 180 degrees. FIG. 6 and FIG. 7 illustrate a magnetic flux density detected by the magnetic detection elements 12 when the position of each of the magnetic detection elements 12 is shifted in the x direction at a predetermined interval along the arrow A in FIG. 2.

Note that the alternating current of same magnitude is flowing in the two current measuring conductors 10.

Each of vertical axes in FIG. 6 and FIG. 7 indicates a rate of change (%) in a magnetic flux density with reference to a case in which a frequency of the alternating current flowing in the current measuring conductors 10 is 100 Hz, and each of the horizontal axes indicates the frequency. FIG. 6 indicates a magnetic flux density detected by the magnetic detection elements 12 of the current measuring conductor 10 on the left side of the current detection device 101 of the reference example, and FIG. 7 indicates a magnetic flux density detected by the magnetic detection elements 12 of the current measuring conductor 10 on the left side of the current detection device 102 of the first embodiment.

The lines connected at white circle points in FIG. 6 and FIG. 7 indicate cases in which a distance between a left end of the gap 11 and the magnetic detection elements 12 (which is a distance between the left end of the gap 11 and the center of the magnetic detection elements 12, and the same applies hereinafter) is 7.2 mm, the lines connected at square points indicate cases in which the distance between the left end of the gap 11 and the magnetic detection elements 12 is 5.2 mm, the lines connected at triangle points indicate cases in which the distance between the left end of the gap 11 and the magnetic detection elements 12 is 4.0 mm, the lines connected at rhomboidal points indicate cases in which the distance between the left end of the gap 11 and the magnetic detection elements 12 is 2.8 mm, and the lines connected at asterisk points indicate cases in which the distance between the left end of the gap 11 and the magnetic detection elements 12 is 0.8 mm.

As indicated with the lines connected at the white circle points in FIG. 6, when the magnetic detection elements 12 are arranged at the positions near a right end of the gap 11, a magnetic flux density detected by the magnetic detection elements 12 tends to increase as the frequency of the alternating current flowing in the current measuring conductors 10 is increased. For example, when the frequency is 1000 Hz, the magnetic flux density increases by 20% compared to a case in which the frequency is 100 Hz, and when the frequency is 10000 Hz, the magnetic flux density increases by 18%. On the other hand, as indicated with the lines connected at the asterisk points in FIG. 6, when the magnetic detection elements 12 are arranged at the positions near a left end of the gap 11, a magnetic flux density detected by the magnetic detection elements 12 tends to decrease as the frequency of the alternating current flowing in the current measuring conductors 10 is increased. For example, when the frequency is 1000 Hz, the magnetic flux density decreases by 12% compared to a case in which the frequency is 100 Hz, and when the frequency is 10000 Hz, the magnetic flux density decreases by 14%.

As shown in FIG. 6, for example, when the frequency is 10000 Hz, in the current detection device 101 of the reference example, an error variation of 32% is generated in the magnetic flux density detected by the magnetic detection elements 12 between the case in which the magnetic detection elements 12 are arranged in the positions near the right end of the gap 11 and the case in which the magnetic detection elements 12 are arranged in the positions near the left end of the gap 11. This indicates that an error of the magnetic flux density detected by the magnetic detection elements 12 is greater when a position in which the magnetic detection elements 12 are implemented is shifted. Note that greater error is generated as well in other cases such as a case in which the frequency is 1000 Hz or 100000 Hz and so on.

As indicated with the lines connected at the white circle points in FIG. 7, when the magnetic detection elements 12 are arranged at the positions near a right end of the gap 11, a magnetic flux density detected by the magnetic detection elements 12 tends to gradually decrease as the frequency of the alternating current flowing in the current measuring conductors 10 is increased. For example, when the frequency is 1000 Hz, the magnetic flux density decreases by 5% compared to a case in which the frequency is 100 Hz, and when the frequency is 10000 Hz, the magnetic flux density decreases by 7%. In addition, as indicated with the lines connected at the asterisk points in FIG. 7, when the magnetic detection elements 12 are arranged at the positions near a left end of the gap 11, a magnetic flux density detected by the magnetic detection elements 12 tends to further gradually decrease as the frequency of the alternating current flowing in the current measuring conductors 10 is increased. For example, when the frequency is 1000 Hz, the magnetic flux density decreases by 2% compared to a case in which the frequency is 100 Hz, and when the frequency is 10000 Hz, the magnetic flux density decreases by 5%.

As shown in FIG. 7, for example, when the frequency is 10000 Hz, in the current detection device 102 of the first embodiment, an error variation of 2% is generated in the magnetic flux density detected by the magnetic detection elements 12 between the case in which the magnetic detection elements 12 are arranged in the positions near the right end of the gap 11 and the case in which the magnetic detection elements 12 are arranged in the positions near the left end of the gap 11. This indicates that an error of the magnetic flux density detected by the magnetic detection elements 12 is less when a position in which the magnetic detection elements 12 are implemented is shifted. Note that the error is less as well in other cases such as a case in which the frequency is 1000 Hz or 100000 Hz and so on.

From the above, it can be learned that in a case in which phases of the alternating currents flowing in the two current measuring conductors 10 are shifted from each other by 180 degrees, a detection error of a magnetic flux density due to shifting of the positions of the magnetic detection elements 12 is less in the current detection device 102 of the first embodiment than in the current detection device 101 of the reference example. Accordingly, in the perspective of the detection error of the magnetic flux density due to the shifting of the positions of the magnetic detection elements 12, it can be learned that a configuration is superior, in which the two current measuring conductors 10 are arranged side by side in the x direction such that the current paths 14 with greater width face with each other.

Figure 8:
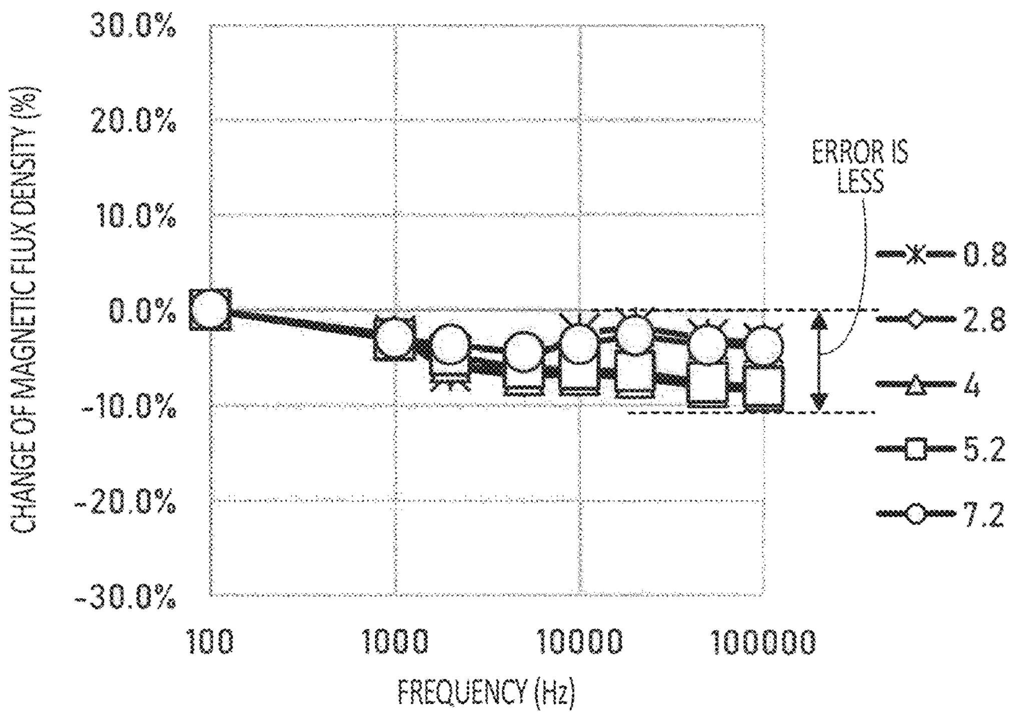
FIG. 8 is a graph illustrating the performance of the current detection device 101 in the reference example.
Figure 9:
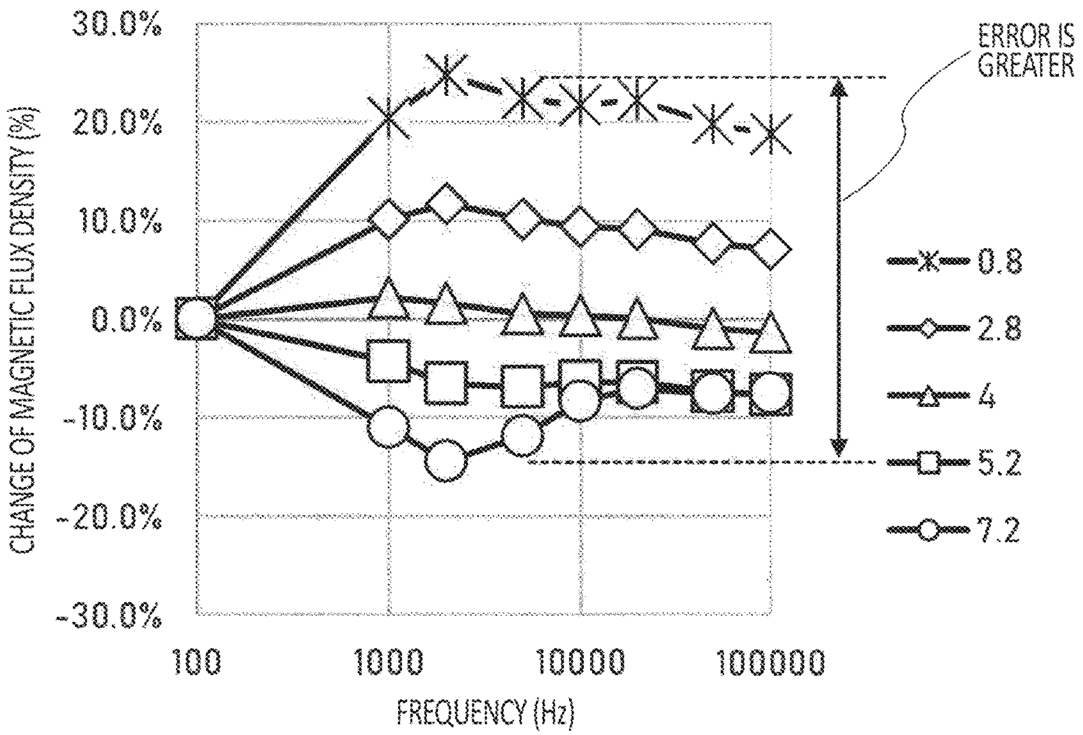
FIG. 9 is a graph illustrating the performance of the current detection device 102 in the first embodiment.

FIG. 8 is a graph illustrating a performance of the current detection device 101 in the reference example, and FIG. 9 is a graph illustrating a performance of the current detection device 102 of the first embodiment. FIG. 8 and FIG. 9 illustrate a change due to a frequency of a magnetic flux density detected by each of the magnetic detection elements 12 in a case in which phases of the alternating currents flowing in two current measuring conductors 10 are in-phase. FIG. 8 and FIG. 9 illustrate a magnetic flux density detected by the magnetic detection elements 12 when the position of each of the magnetic detection elements 12 is shifted in the x direction at a predetermined interval along the arrow A in FIG. 2.

Each of vertical axes in FIG. 8 and FIG. 9 indicates a rate of change (%) in a magnetic flux density with reference to a case in which a frequency of the alternating current flowing in the current measuring conductors 10 is 100 Hz, and each of the horizontal axes indicates the frequency. FIG. 8 indicates a magnetic flux density detected by the current measuring conductor 10 on the left side of the current detection device 101 of the reference example, and FIG. 9 indicates a magnetic flux density detected by the current measuring conductor 10 on the left side of the current detection device 102 of the first embodiment.

The lines connected at white circle points in FIG. 8 and FIG. 9 indicate cases in which a distance between a left end of the gap 11 and the magnetic detection elements 12 is 7.2 mm, the lines connected at square points indicate cases in which the distance between the left end of the gap 11 and the magnetic detection elements 12 is 5.2 mm, the lines connected at triangle points indicate cases in which the distance between the left end of the gap 11 and the magnetic detection elements 12 is 4.0 mm, the lines connected at rhomboidal points indicate cases in which the distance between the left end of the gap 11 and the magnetic detection elements 12 is 2.8 mm, and the lines connected at asterisk points indicate cases in which the distance between the left end of the gap 11 and the magnetic detection elements 12 is 0.8 mm.

As indicated with the lines connected at the white circle points in FIG. 8, when the magnetic detection elements 12 are arranged at the positions near a right end of the gap 11, a magnetic flux density detected by the magnetic detection elements 12 tends to gradually decrease as the frequency of the alternating current flowing in the current measuring conductors 10 is increased. For example, when the frequency is 1000 Hz, the magnetic flux density decreases by 3% compared to a case in which the frequency is 100 Hz, and when the frequency is 10000 Hz, the magnetic flux density decreases by 3%. In addition, as indicated with the lines connected at the asterisk points in FIG. 8, when the magnetic detection elements 12 are arranged at the positions near a left end of the gap 11, a magnetic flux density detected by the magnetic detection elements 12 tends to gradually decrease as the frequency of the alternating current flowing in the current measuring conductors 10 is increased. For example, when the frequency is 1000 Hz, the magnetic flux density decreases by 3% compared to a case in which the frequency is 100 Hz, and when the frequency is 10000 Hz, the magnetic flux density decreases by 3%.

As shown in FIG. 8, for example, when the frequency is 10000 Hz, in the current detection device 101 of the first example, an error variation of 0% is generated in the magnetic flux density detected by the magnetic detection elements 12 between the case in which the magnetic detection elements 12 are arranged in the positions near the right end of the gap 11 and the case in which the magnetic detection elements 12 are arranged in the positions near the left end of the gap 11. This indicates that an error of the magnetic flux density detected by the magnetic detection elements 12 is less when a position in which the magnetic detection elements 12 are implemented is shifted. Note that the error is less as well in other cases such as a case in which the frequency is 1000 Hz or 100000 Hz and so on.

As indicated with the lines connected at the white circle points in FIG. 9, when the magnetic detection elements 12 are arranged at the positions near a right end of the gap 11, a magnetic flux density detected by the magnetic detection elements 12 tends to decrease as the frequency of the alternating current flowing in the current measuring conductors 10 is increased. For example, when the frequency is 1000 Hz, the magnetic flux density decreases by 11% compared to a case in which the frequency is 100 Hz, and when the frequency is 10000 Hz, the magnetic flux density decreases by 9%. In addition, as indicated with the lines connected at the asterisk points in FIG. 9, when the magnetic detection elements 12 are arranged at the positions near a left end of the gap 11, a magnetic flux density detected by the magnetic detection elements 12 tends to increase as the frequency of the alternating current flowing in the current measuring conductors 10 is increased. For example, when the frequency is 1000 Hz, the magnetic flux density increases by 20% compared to a case in which the frequency is 100 Hz, and the magnetic flux density increases by 22% when the frequency is 10000 Hz.

As shown in FIG. 9, for example, when the frequency is 10000 Hz, in the current detection device 102 of the first embodiment, an error variation of 31% is generated in the magnetic flux density detected by the magnetic detection elements 12 between the case in which the magnetic detection elements 12 are arranged in the positions near the right end of the gap 11 and the case in which the magnetic detection elements 12 are arranged in the positions near the left end of the gap 11. This indicates that an error of the magnetic flux density detected by the magnetic detection elements 12 is greater when a position in which the magnetic detection elements 12 are implemented is shifted. Note that greater error is generated as well in other cases such as a case in which the frequency is 1000 Hz or 100000 Hz and so on.

It can be learned that in a case in which the phases of the alternating currents flowing in the two current measuring conductors 10 are in-phase, a detection error of a magnetic flux density due to shifting of the positions of the magnetic detection elements 12 is less in the current detection device 101 of the reference example than in the current detection device 102 of the first embodiment. Accordingly, in a case in which the phases of the alternating currents flowing in the two current measuring conductors 10 are in-phase, in a perspective of the detection error of the magnetic flux density due to shifting of the positions of the magnetic detection elements 12, the two current measuring conductors 10 may be arranged side by side in the x direction such that the current paths 13 with less widths face each other.

Figure 10:
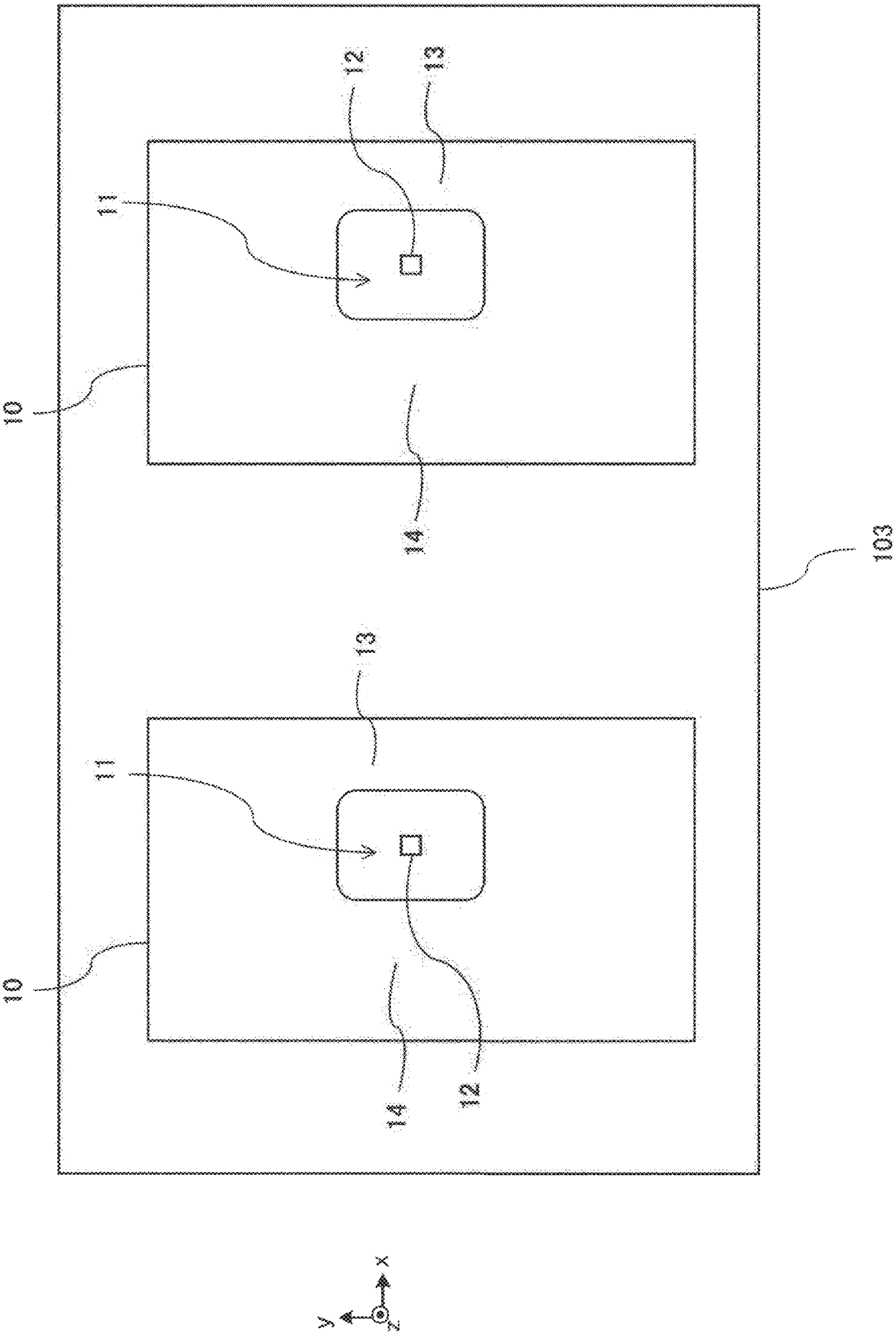
FIG. 10 is a top view illustrating a schematic configuration of a current detection device 103 in a comparative example.

FIG. 10 is a top view illustrating a schematic configuration of a current detection device 103 in a comparative example. As shown in FIG. 10, the current detection device 103 of the comparative example includes two current measuring conductors 10. The current detection device 103 in the comparative example is a configuration of two current measuring conductors 10 aligned in a same direction, each of the two current measuring conductors 10 is the same as the current measuring conductors 10 indicated in FIG. 1. That is, two current measuring conductors 10 in which each current path 13 with less width is arranged on the right side and each current path 14 with greater width is arranged on the left side are arranged in a same manner to be aligned, and accordingly the current path 13 with less width and the current path 14 with greater width are arranged to face each other.

Figure 11:
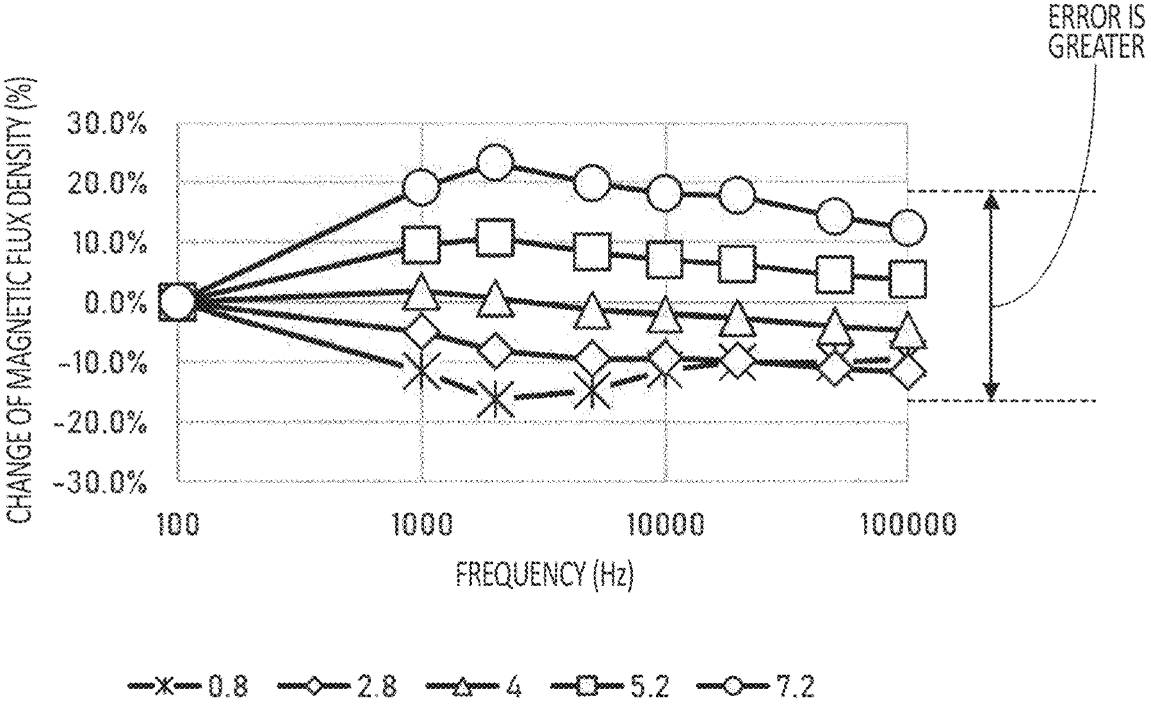
FIG. 11 is a graph illustrating a performance of a current detection device 103 of the comparative example.
Figure 12:
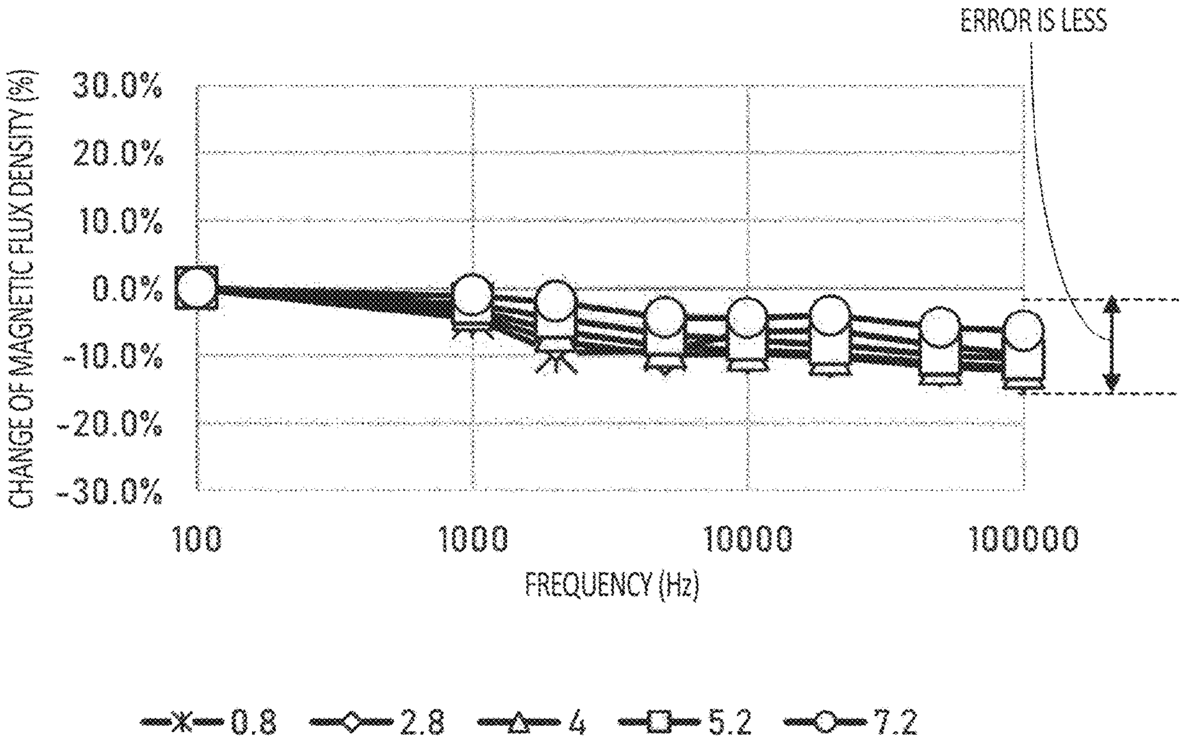
FIG. 12 is a graph illustrating the performance of a current detection device 103 of the comparative example.

FIG. 11 and FIG. 12 are graphs illustrating a performance of a current detection device 103 of the comparative example. FIG. 11 and FIG. 12 illustrate a change due to a frequency of a magnetic flux density detected by each of the magnetic detection elements 12 in a case in which phases of the alternating currents flowing in two current measuring conductors 10 are shifted from each other by 180 degrees. FIG. 11 and FIG. 12 illustrate a magnetic flux density detected by the magnetic detection elements 12 when the position of each of the magnetic detection elements 12 is shifted in the x direction at a predetermined interval along the arrow A in FIG. 2.

Each of vertical axes in FIG. 11 and FIG. 12 indicates a rate of change (%) in a magnetic flux density with reference to a case in which a frequency of the alternating current flowing in the current measuring conductors 10 is 100 Hz, and each of the horizontal axes indicates the frequency. FIG. 11 indicates a magnetic flux density detected by the magnetic detection elements 12 of the current measuring conductor 10 on the left side of the current detection device 103 of the comparative example, and FIG. 12 indicates a magnetic flux density detected by the magnetic detection elements 12 of the current measuring conductor 10 on the right side of the current detection device 103 of the comparative example.

The lines connected at white circle points in FIG. 11 and FIG. 12 indicate cases in which a distance between a left end of the gap 11 and the magnetic detection elements 12 is 7.2 mm, the lines connected at square points indicate cases in which the distance between the left end of the gap 11 and the magnetic detection elements 12 is 5.2 mm, the lines connected at triangle points indicate cases in which the distance between the left end of the gap 11 and the magnetic detection elements 12 is 4.0 mm, the lines connected at rhomboidal points indicate cases in which the distance between the left end of the gap 11 and the magnetic detection elements 12 is 2.8 mm, and the lines connected at asterisk points indicate cases in which the distance between the left end of the gap 11 and the magnetic detection elements 12 is 0.8 mm.

As shown in FIG. 11 and FIG. 12, in the current detection device 103 of the comparative example, an error of a magnetic flux density detected by the magnetic detection elements 12 of the current measuring conductor 10 on the left side is large, and an error of a magnetic flux density detected by the magnetic detection elements 12 of the current measuring conductor 10 on the right side is small. Accordingly, it can be learned that, when the current measuring conductors 10 are aligned in a same orientation, there is a variation between one with greater error and another one with less error.

Figure 13:
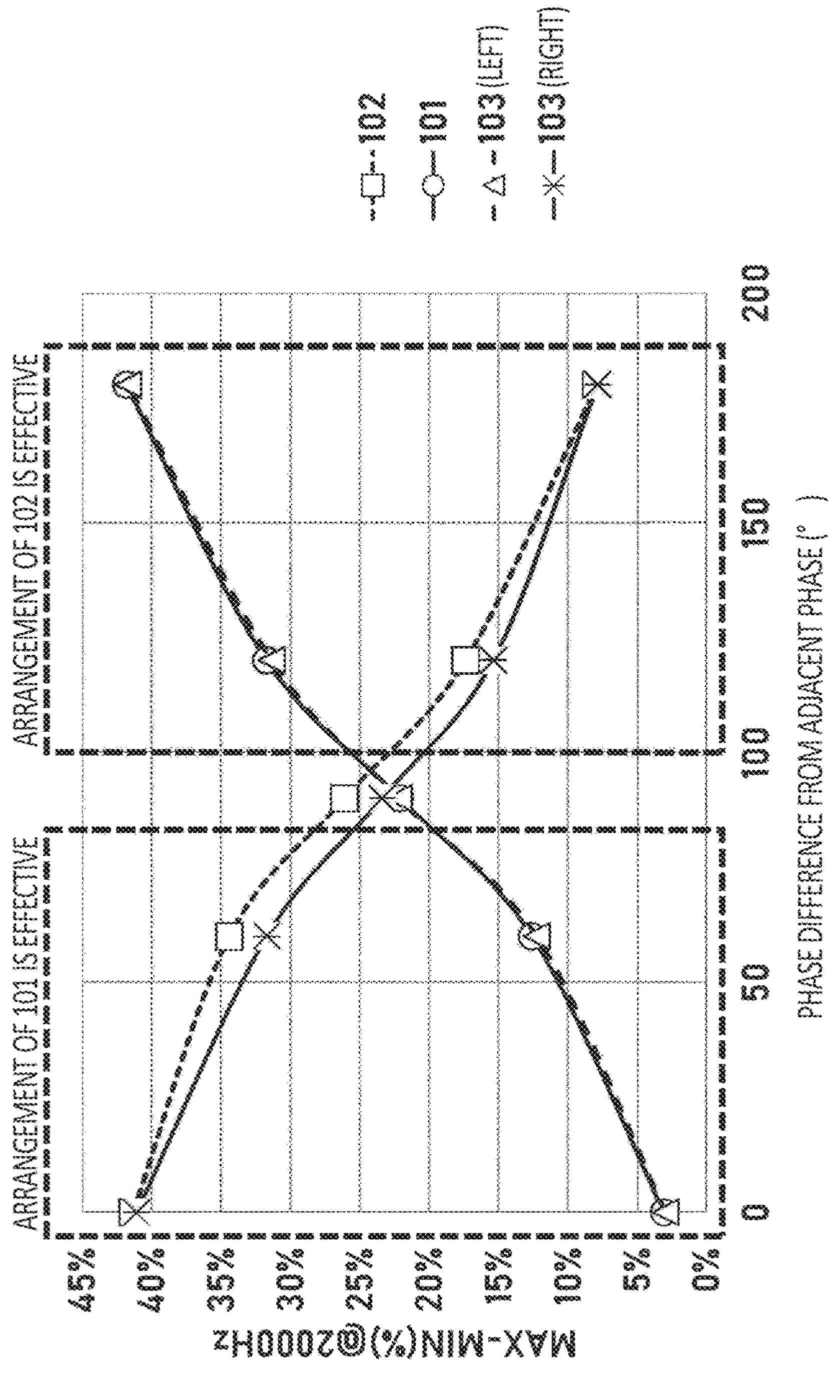
FIG. 13 is a graph illustrating a relationship between a phase difference of alternating currents flowing in two current measuring conductors 10 and an error of a magnetic flux density that is detected in the first embodiment, in a comparative example and a reference example.

FIG. 13 is a graph illustrating a relationship between a phase difference of alternating currents flowing in two current measuring conductors 10 and an error of a magnetic flux density that is detected in the first embodiment, in a reference example, and in a comparative example. In FIG. 13, dashed lines connected at square points indicate a graph of the current detection device 102 of the first embodiment, and solid lines connected at white circle points indicate a graph of the current detection device 101 of the reference example. In FIG. 13, dashed lines connected at triangle points indicate a graph of the current measuring conductor 10 on the left side in the current detection device 103 of the comparative example, and solid lines connected at asterisk points indicate a graph of the current measuring conductor 10 on the right side in the current detection device 103 of the comparative example. The vertical axis of FIG. 13 indicates an error of a magnetic flux density detected by arrangement of the magnetic detection elements 12 when the frequency of the alternating current is 2000 Hz. The horizontal axis of FIG. 13 indicates a phase difference of the alternating currents flowing in the two current measuring conductors 10.

From the above, by selecting, for the two current measuring conductors 10, the arrangement of the reference example or the arrangement of the first embodiment in response to the phase of the alternating current, the detection error of the magnetic flux density due to shifting of the positions of the magnetic detection elements 12 can be reduced compared to the arrangement of the comparative example.

As shown in FIG. 13, in a range in which the phase difference of the alternating currents flowing in the two current measuring conductors 10 is 0 to 80 degrees, because an error of the magnetic flux density detected by the arrangement of the magnetic detection elements 12 is less in the current detection device 101 of the reference example than the current detection device 103 of the comparative example, the current detection device 101 of the reference example in which the current paths 13 with less widths face each other may be adopted. On the other hand, in a range in which the phase difference of the alternating currents flowing in the two current measuring conductors 10 is 100 to 180 degrees, it can be learned that an error of the magnetic flux density detected by the arrangement of the magnetic detection elements 12 is less in the current detection device 102 of the first embodiment than the current detection device 103 of the comparative example.

Figure 14:
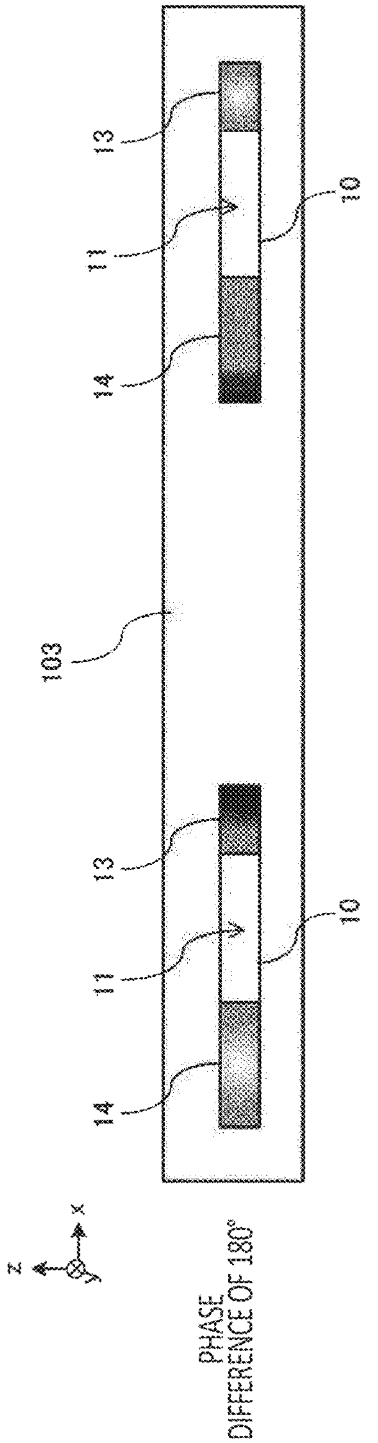
FIG. 14 shows a distribution of current density of a current detection device 103 in a comparative example.
Figure 15:
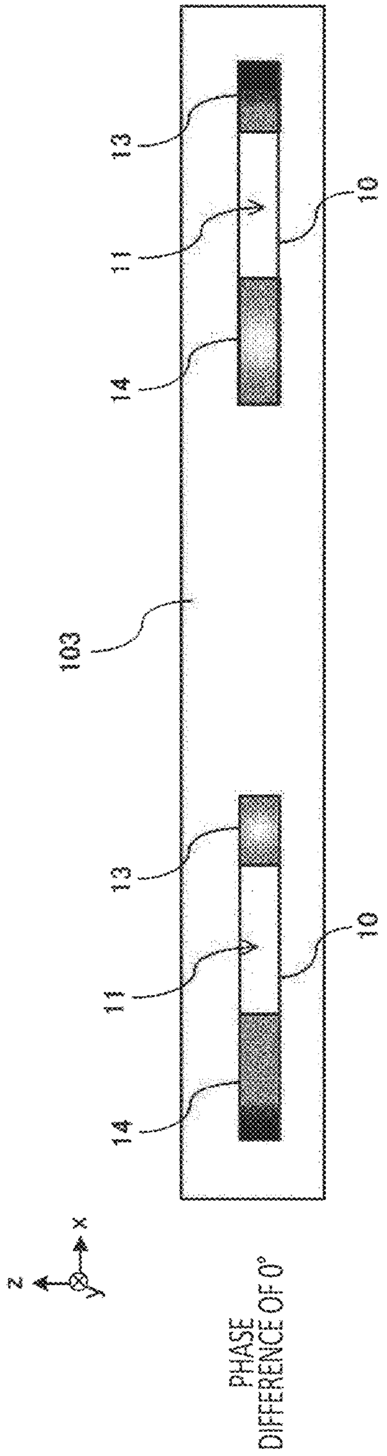
FIG. 15 shows a distribution of current density of a current detection device 103 in a comparative example.

The reason why the magnitude of the error of the magnetic flux density detected by the arrangement of the magnetic detection elements 12 is changed by the phase difference of the alternating currents flowing in the two current measuring conductors 10 as illustrated in FIG. 13 is described by a distribution of current density of the current measuring conductors 10 described below. FIG. 14 and FIG. 15 show a distribution of current density of a current detection device 103 in a comparative example. In FIG. 14 and FIG. 15, the current density is indicated by hatching in the current path 13 with less width and the current path 14 with greater width. The hatching in a portion with high current density is thick, and the hatching in a portion with low current density is thin. FIG. 14 indicates a case in which the phases of the alternating currents flowing in the two current measuring conductors 10 are shifted from each other by 180 degrees, and FIG. 15 indicates a case in which the phase of the alternating current flowing in the two current measuring conductors 10 is in-phase.

As shown in FIG. 14, in a case in which the phases are shifted from each other by 180 degrees, current density of each current path that is closer to another current measuring conductor 10 is higher. That is, in the current measuring conductor 10 on the left side, a current crowding is caused on the right side of the current path 13 with less width on the right side, and in the current measuring conductor 10 on the right side, a current crowding is caused on the left side of the current path 14 with greater width on the left side. This is caused by the generation of an eddy current in the another current measuring conductor 10 due to a flux generated by the current flowing in one of the current measuring conductors 10. For example, when the current is flowing toward a +y direction (a direction into the page) in the current measuring conductor 10 on the left side, the current is flowing toward a −y direction (a direction out of the page) in the current measuring conductor 10 on the right side, and due to a flux generated by the current flowing in the current measuring conductor 10 on the right side, an eddy current of the +y direction is generated particularly near the current path 13 with less width of the current measuring conductor 10 on the left side. In this way, the current density on the right side of the current path 13 with less width on the right side is higher.

On the contrary, as shown in FIG. 15, in a case in which the phase is in-phase, current density of a current path that is farther from another current measuring conductor 10 is higher. That is, in the current measuring conductor 10 on the left side, a current crowding is caused on the left side of the current path 14 with greater width on the left side, and in the current measuring conductor 10 on the right side, a current crowding is caused on the right side of the current path 13 with less width on the right side. This is caused by the generation of an eddy current in the another current measuring conductor 10 due to a flux generated by the current flowing in one of the current measuring conductors 10. For example, when the current is flowing toward a +y direction (a direction into the page) in the current measuring conductor 10 on the left side, the current is flowing toward a +y direction (direction into the page) in the current measuring conductor 10 on the right side, and due to a flux generated by the current flowing in the current measuring conductor 10 on the right side, an eddy current of the −y direction is generated particularly near the current path 13 with less width of the current measuring conductor 10 on the left side. In this way, in the current path 13 with less width of the current measuring conductor 10 on the left side, the current flowing therein is canceled by the eddy current coming from the another current measuring conductor 10, thus the current density on the left side of the current path 14 with greater width on the left side increases. In this manner, when the current density of either of the right or left current path of the another current measuring conductor 10 increases due to the influence of one of the current measuring conductors 10, if the current measuring conductors 10 are arranged in an orientation in which the current density of the current path 14 with greater width increases, an error of the magnetic flux density detect by the magnetic detection elements 12 can be reduced. As described above, because whether the current density of the current path of the right or left current measuring conductor 10 increases changes depending on a phase difference relative to the current flowing in the another current measuring conductor 10, whether the current detection device 101 of the reference example or the current detection device 102 of the first embodiment should be adopted also changes depending on the phase difference relative to the current flowing in the another current measuring conductor 10.

Hereinabove, as shown in FIG. 14 and FIG. 15, when two asymmetric current measuring conductors 10 each including a current path 13 with less width and a current path 14 with greater width are used, a bias in the current density is generated due to the phase difference of the current flowing in the right and left current measuring conductors 10. When the phases are shifted from each other by 180 degrees, a current crowding is generated in an inner current path, and when the phase is in-phase, a current crowding is generated in an outer current path.

Figure 16:
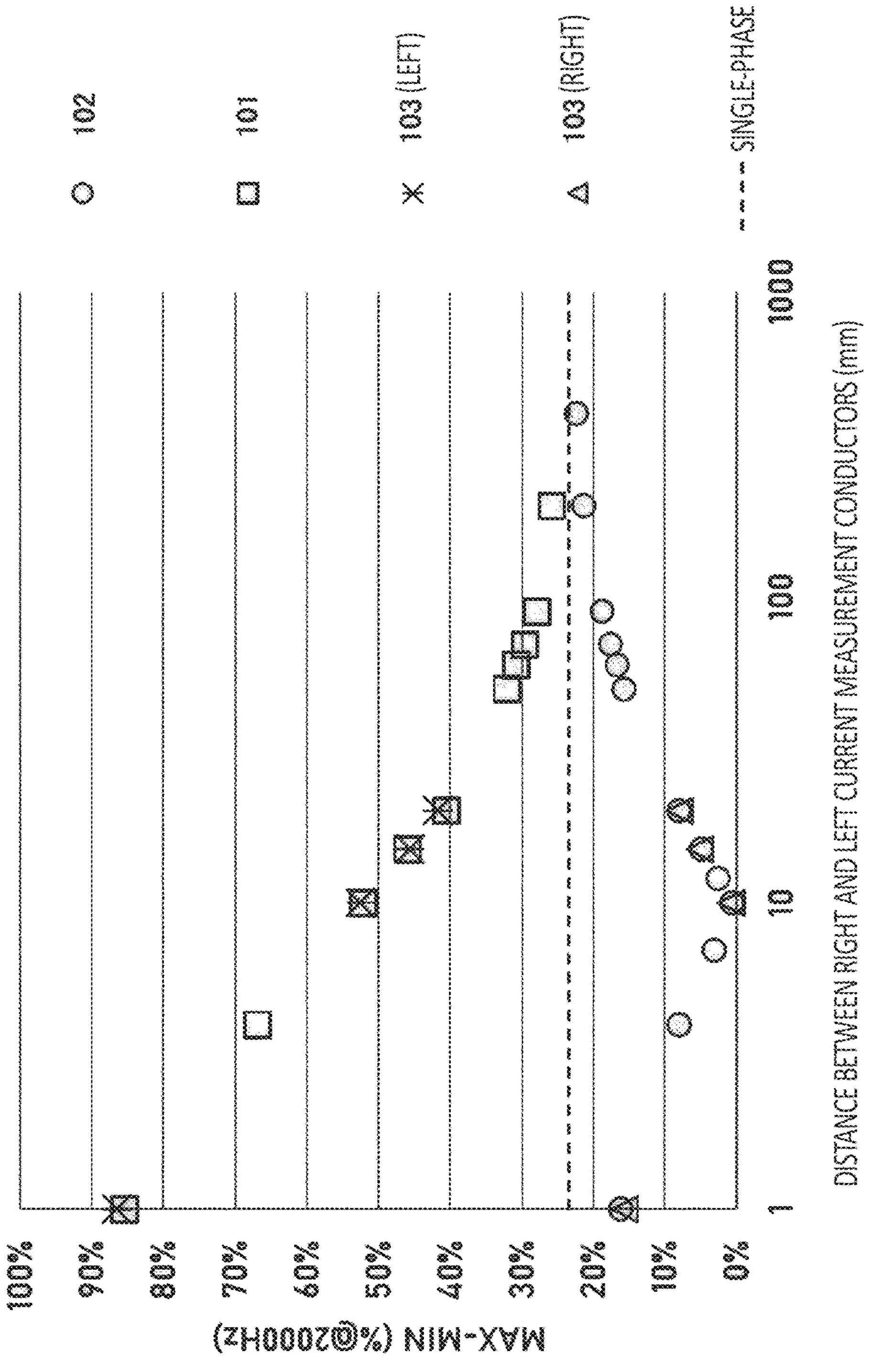
FIG. 16 is a graph illustrating a range in which an arrangement configuration of the current detection device 102 in the first embodiment is effective.

FIG. 16 is a graph illustrating a range in which an arrangement configuration of the current detection device 102 in the first embodiment is effective. Square points in FIG. 16 indicate an error of the magnetic flux density detected by the current measuring conductor 10 on the left side of the current detection device 101 of the reference example, white circle points indicate an error of the magnetic flux density detected by the current measuring conductor 10 on the left side of the current detection device 102 of the first embodiment, triangle points indicate an error of the magnetic flux density detected by the current measuring conductor 10 on the right side of the current detection device 103 in the comparative example, asterisk points indicate an error of the magnetic flux density detected by the current measuring conductor 10 on the left side of the current detection device 103 of the comparative example, and dashed lines indicate an error of the magnetic flux density detected by the current measuring conductors 10 of a single-phase current detection device. The vertical axis in FIG. 16 indicates the maximum value of an error of the magnetic flux density detected by the arrangement of the magnetic detection elements 12, and the horizontal axis indicates a distance (mm) between the right and left current measuring conductors 10. In addition, FIG. 16 indicates an example in a case in which frequencies of the alternating currents flowing in the two current measuring conductors 10 are 2000 Hz and the phases are shifted from each other by 180 degrees.

As shown in FIG. 16, in a range in which the distance between the right and left current measuring conductors 10 is 10 mm or less, while an error of the magnetic flux density of the current detection device 101 of the reference example is a large numerical value, an error of the magnetic flux density of the current detection device 102 of the first embodiment is a small numerical value, and difference between the errors of the two magnetic flux densities is large. Note that the difference between the two errors decreases as the distance between the right and left current measuring conductors 10 increases. As the distance between the right and left current measuring conductors 10 approaches closer to 100 mm, both of the error of the magnetic flux density of the current detection device 101 of the reference example and the error of the magnetic flux density of the current detection device 102 of the first embodiment approaches closer to that of the single-phase current detection device, and if the distance between the right and left current measuring conductors 10 exceeds 100 mm, the difference between the two errors becomes approximately zero. This is because as one of the current measuring conductors 10 is separated farther from another current measuring conductor 10, the influence of the eddy current received from the another current measuring conductor 10 decreases.

Accordingly, as described above, in a case in which the phases of the alternating currents flowing in the two current measuring conductors 10 are shifted from each other by 180 degrees, a detection error of a magnetic flux density due to shifting of the positions of the magnetic detection elements 12 can be reduced in the current detection device 102 of the first embodiment than the current detection device 103 of the comparative example. In addition, in a case in which the phases of the alternating currents flowing in the two current measuring conductors 10 are shifted from each other by 180 degrees, a detection error of a magnetic flux density due to shifting of the positions of the magnetic detection elements 12 can be reduced in the current detection device 102 of the first embodiment than in the current detection device 101 of the reference example. Note that it can be learned that as the distance between the current measuring conductors 10 increases, the effect of reducing the detection error by the above-described arrangement configuration is weakened.

Note that in a case in which the phases of the alternating currents flowing in the two current measuring conductors 10 are shifted from each other by 180 degrees as shown in FIG. 16, an error of the magnetic flux density detected by the magnetic detection elements 12 of the current measuring conductor 10 on the right side of the current detection device 103 of the comparative example is close to the value of the error of the magnetic flux density detected by the current measuring conductor 10 on the left side of the current detection device 102 of the first embodiment, and an error of the magnetic flux density detected by the magnetic detection elements 12 of the current measuring conductor 10 on the left side of the current detection device 103 of the comparative example is a numerical value closer to the value of the error of the magnetic flux density detected by the current measuring conductor 10 on the left side of the current detection device 101 of the reference example.

Figure 17:
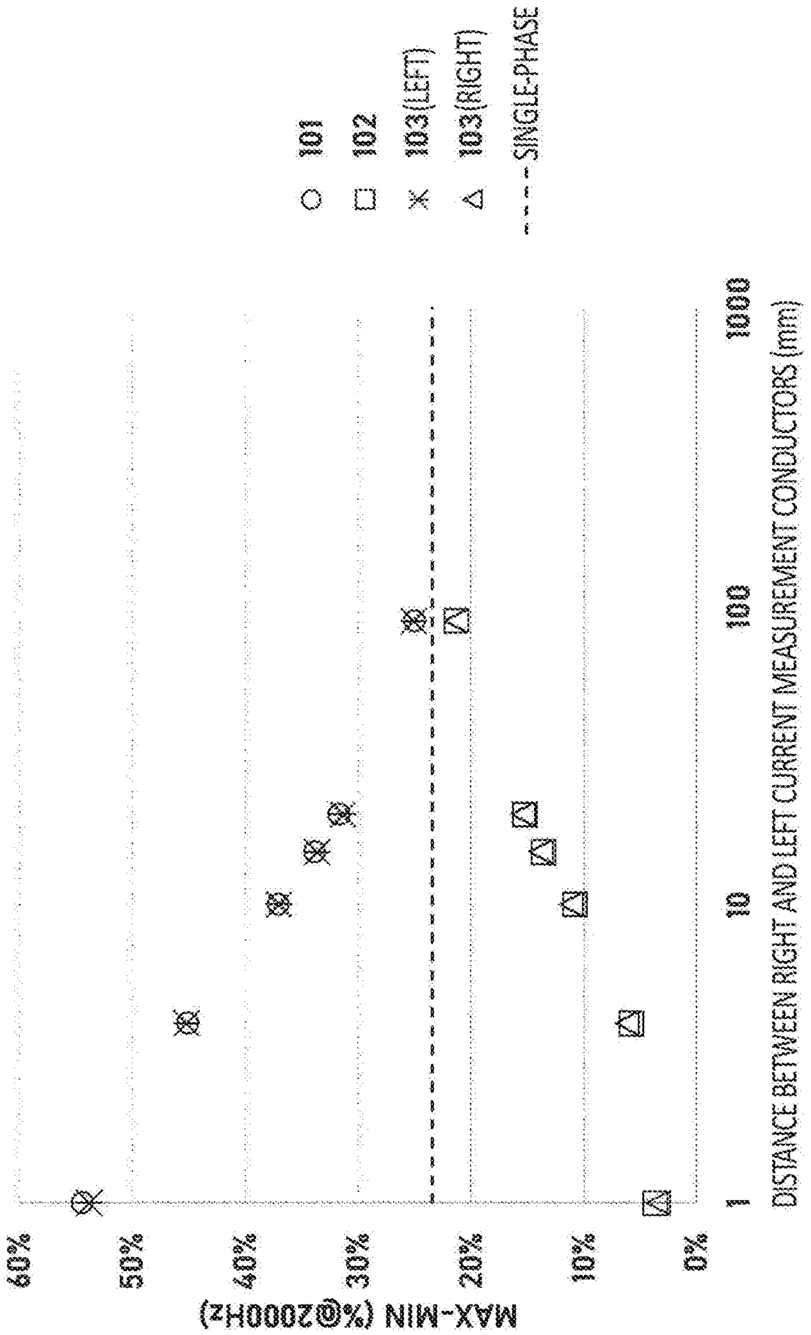
FIG. 17 is a graph illustrating a range in which the arrangement configuration of the current detection device 102 in the first embodiment is effective.

FIG. 17 is a graph illustrating a range in which the arrangement configuration of the current detection device 102 in the first embodiment is effective. White circle points in FIG. 17 indicate an error of the magnetic flux density detected by the current measuring conductor 10 on the left side of the current detection device 101 of the reference example, square points indicate an error of the magnetic flux density detected by the current measuring conductor 10 on the left side of the current detection device 102 of the first embodiment, triangle points indicate an error of the magnetic flux density detected by the current measuring conductor 10 on the right side of the current detection device 103 in the comparative example, asterisk points indicate an error of the magnetic flux density detected by the current measuring conductor 10 on the left side of the current detection device 103 of the comparative example, and dashed lines indicate an error of the magnetic flux density detected by the current measuring conductors 10 of a single-phase current detection device. The vertical axis in FIG. 17 indicates the maximum value of an error of the magnetic flux density detected by the arrangement of the magnetic detection elements 12, and the horizontal axis indicates a distance (mm) between the right and left current measuring conductors 10. In addition, FIG. 17 indicates an example in a case in which frequencies of the alternating currents flowing in the two current measuring conductors 10 are 2000 Hz and the phase are shifted by 120 degrees.

As understood in FIG. 17, even in a case in which the phases of the alternating currents flowing in the two current measuring conductors 10 are shifted by 120 degrees, similar to the case in which the phases are shifted from each other by 180 degrees, the detection error of the magnetic flux density due to shifting of the positions of the magnetic detection elements 12 can be reduced in the current detection device 102 of the first embodiment than the current detection device 103 of the comparative example. In addition, in a case in which the phases of the alternating currents flowing in the two current measuring conductors 10 are shifted by 120 degrees, a detection error of a magnetic flux density due to shifting of the positions of the magnetic detection elements 12 can be reduced in the current detection device 102 of the first embodiment than in the current detection device 101 of the reference example.

Effects of First Embodiment

According to the current detection device of the first embodiment, in a case in which the phases of the alternating currents flowing in the two current measuring conductors 10 are shifted by 100 degrees to 180 degrees, by arranging the current paths 14 with greater width side by side in the x direction such that the current paths 14 face each other, an error of the magnetic flux density detected by the magnetic detection elements 12 in a case in which the position of implementation of the magnetic detection elements 12 is shifted can be reduced, and the performance due to the shifting of the position to implement the magnetic detection elements 12 can be prevented from decreasing.

First Example of Second Embodiment

Figure 18:
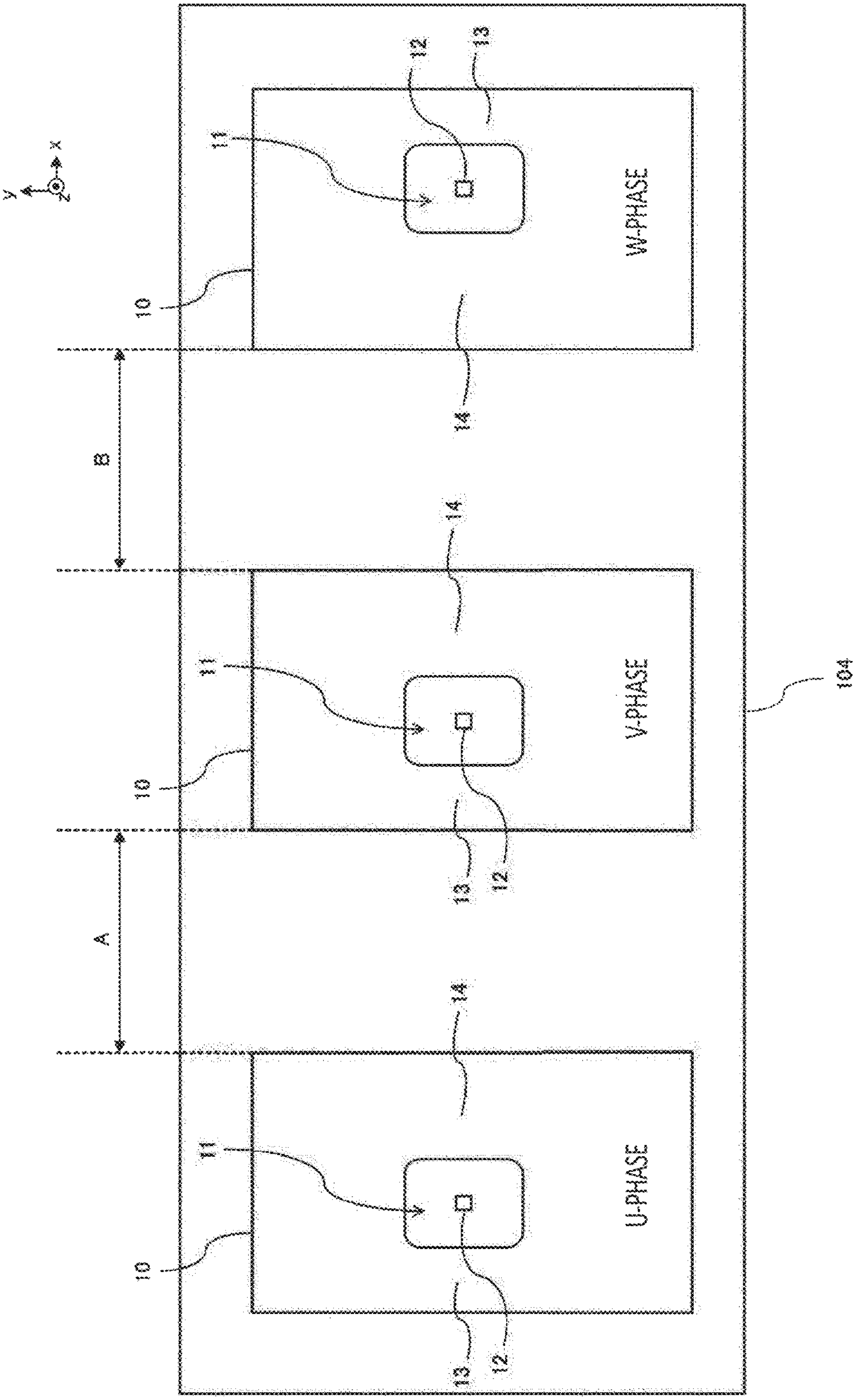
FIG. 18 is a top view illustrating a schematic configuration of a current detection device 104 in a first example of a second embodiment.

FIG. 18 is a top view illustrating a schematic configuration of a current detection device 104 in a first example of a second embodiment. As shown in FIG. 18, the current detection device 104 includes three current measuring conductors 10. Two current measuring conductors 10 among the three current measuring conductors 10 arranged outward are arranged side by side in the x direction such that current paths 14 with greater widths face each other. Two current measuring conductors 10 arranged at the center among the three current measuring conductors 10 are arranged such that a current path 14 with greater width is on the right side. A distance A between the current measuring conductor 10 on the left side and the current measuring conductor 10 at the center is arranged to be the same as a distance B between the current measuring conductor 10 at the center and the current measuring conductor 10 on the right side (A=B).

Second Example of Second Embodiment

Figure 19:
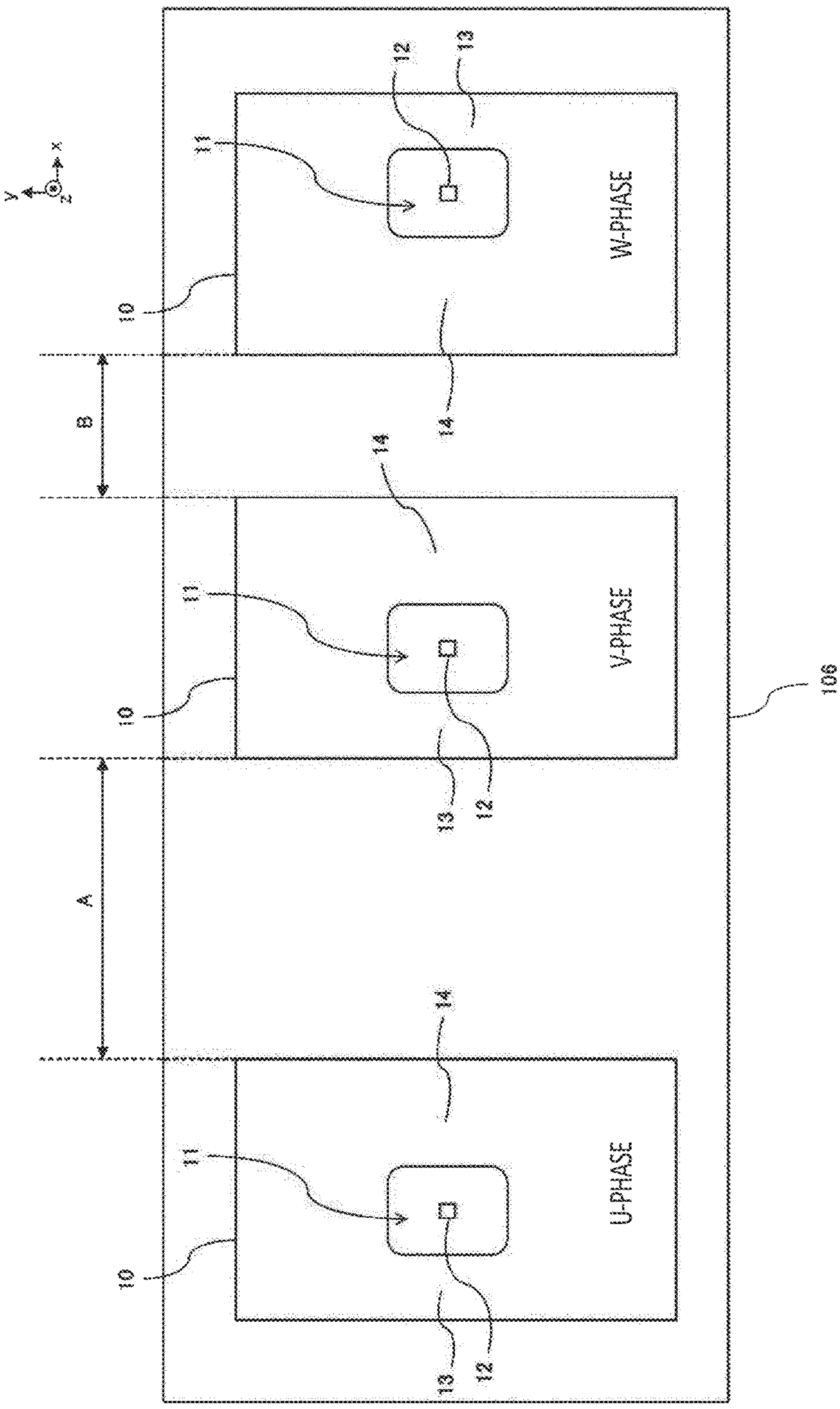
FIG. 19 is a top view illustrating a schematic configuration of the current detection device 106 in a second example of the second embodiment.

FIG. 19 is a top view illustrating a schematic configuration of the current detection device 106 in a second example of the second embodiment. As shown in FIG. 19, the current detection device 106 includes three current measuring conductors 10. Two current measuring conductors 10 among the three current measuring conductors 10 arranged outward are arranged side by side in the x direction such that current paths 14 with greater widths face each other. A current measuring conductor 10 arranged at the center among the three current measuring conductors 10 is arranged such that a current path 14 with greater width is on the right side. A distance A between the current measuring conductor 10 on the left side and the current measuring conductor 10 at the center is arranged to be greater than a distance B between the current measuring conductor 10 at the center and the current measuring conductor 10 on the right side. In the present example, each of the three current measuring conductors 10 corresponds to a U-phase, a V-phase, and a W-phase in three-phase alternating current, and alternating current flowing in the three current measuring conductors 10 may be configured to have a phase different by 120 degrees, respectively. In FIG. 19, the current measuring conductor 10 on the left side may correspond to the U-phase, the current measuring conductor at the center may correspond to the V-phase, and the current measuring conductor 10 on the right side may correspond to the W-phase.

Figure 20:
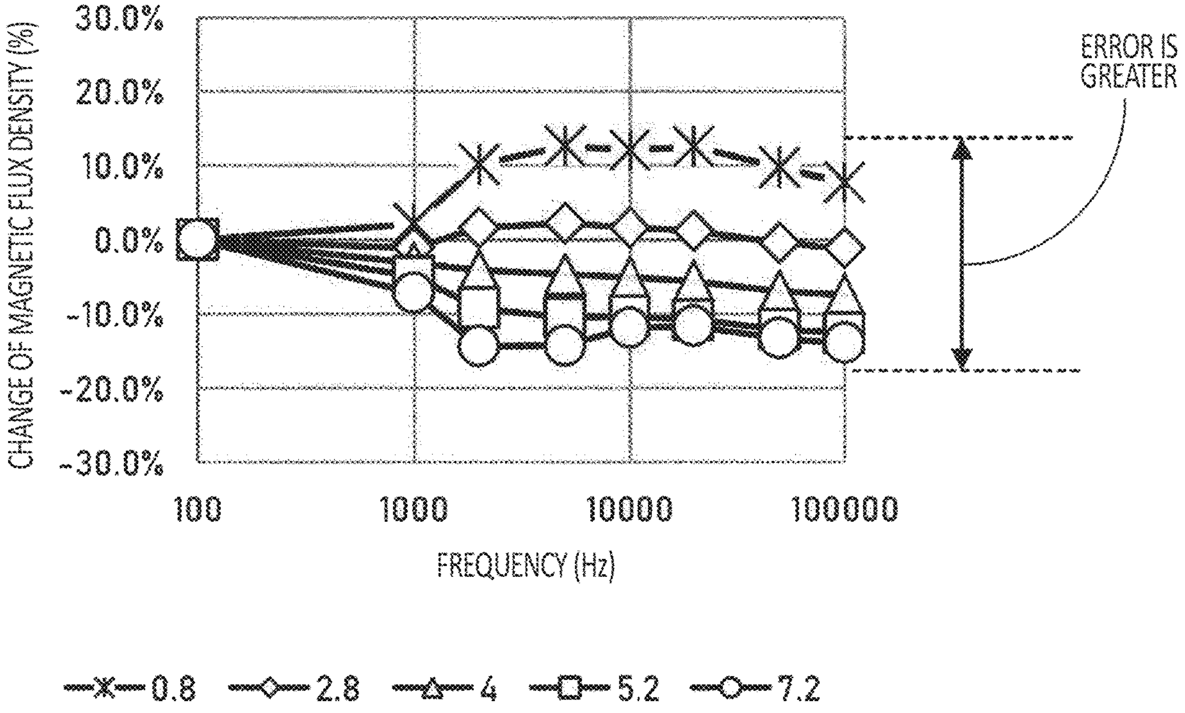
FIG. 20 is a graph illustrating a performance of a current detection device 104 of the first example of the second embodiment.
Figure 21:
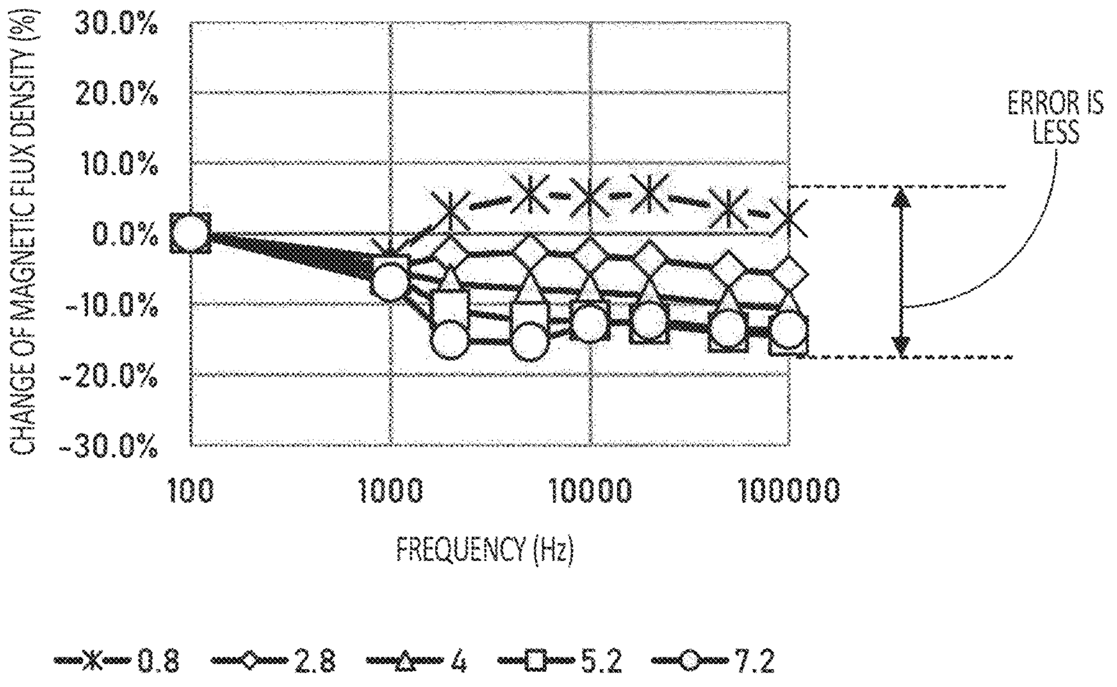
FIG. 21 is a graph illustrating a performance of the current detection device 106 of the second example of the second embodiment.

FIG. 20 is a graph illustrating a performance of a current detection device 104 of the first example of the second embodiment, and FIG. 21 is a graph illustrating a performance of the current detection device 106 of the second example of the second embodiment. The performances caused by distance A and B are compared in FIG. 20 and FIG. 21. FIG. 20 indicates a graph of a rate of change caused by a frequency of magnetic flux density detected by the magnetic detection elements 12 of the current measuring conductors 10 of the V-phase of the current detection device 104 of the first example, and FIG. 21 indicates a graph of a rate of change caused by a frequency of magnetic flux density detected by the magnetic detection elements 12 of the current measuring conductors 10 of the V-phase of the current detection device 106 of the second example.

As shown in FIG. 20 and FIG. 21, an error of the magnetic flux density detected by the magnetic detection elements 12 is less in FIG. 21 than that of FIG. 20. Accordingly, it can be learned that the error of the magnetic flux density detected by the magnetic detection elements 12 is less in a case in which the distance A>distance B compared to a case in which distance A=distance B.

Figure 22:
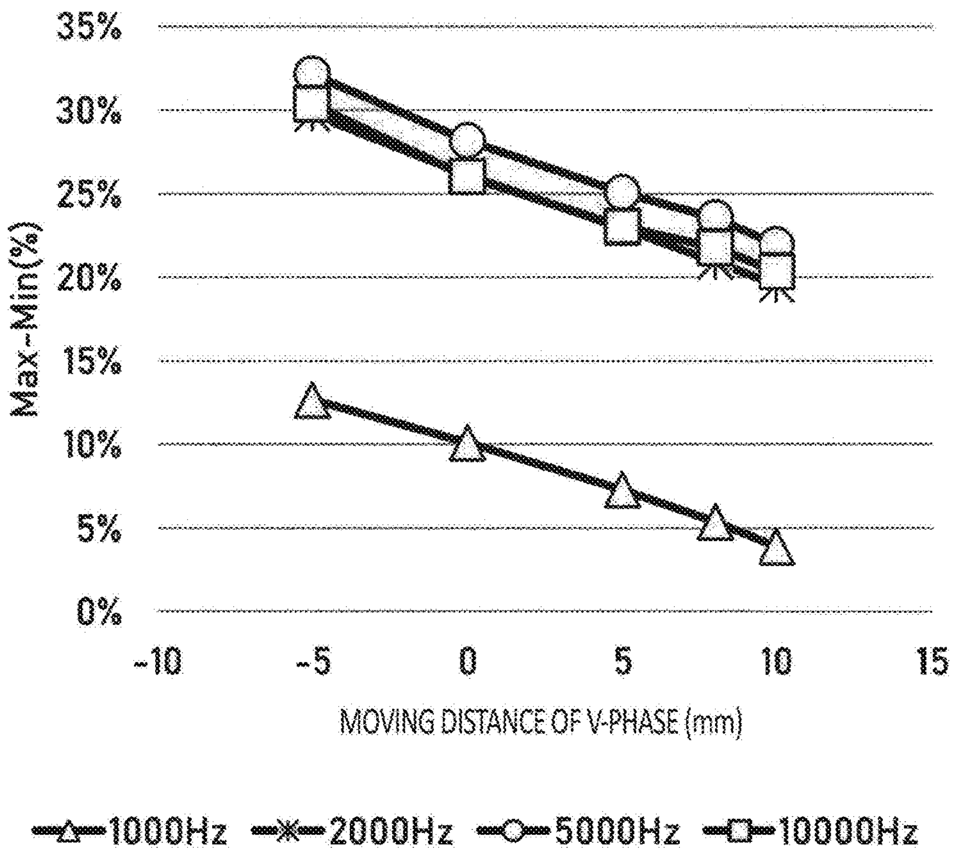
FIG. 22 is a graph indicating a comparison between performances when a distance A and a distance B are varied in the second embodiment.

FIG. 22 is a graph indicating a comparison between performances when a distance A and a distance B are varied in the second embodiment. The horizontal axis of FIG. 22 indicates a moving distance from an equally spaced point (that is, A=B) of the current measuring conductors 10 of the V-phase at the center in the current detection device of the second embodiment. When the current measuring conductors 10 of the V-phase approaches the current measuring conductors 10 on the left side, the moving distance becomes minus, and when the current measuring conductors 10 of the V-phase approaches the current measuring conductors 10 on the right side, the moving distance becomes plus. The vertical axis of FIG. 22 indicates an error of the magnetic flux density detected by the magnetic detection elements 12 of the current measuring conductors 10 of the U-phase.

The lines connected at square points in FIG. 22 indicate cases in which the frequency of the alternating current is 10000 Hz, the lines connected at white circle points indicate cases in which the frequency of the alternating current is 5000 Hz, the lines connected at asterisk points indicate cases in which the frequency of the alternating current is 2000 Hz, and the lines connected at triangle points indicate cases in which the frequency of the alternating current is 1000 Hz.

As shown in FIG. 22, it can be learned that as the current measuring conductor 10 of the V-phase approaches closer to the current measuring conductor 10 of the W-phase on the right side, an error of the magnetic flux density detected by the magnetic detection elements 12 of the current measuring conductors 10 of the U-phase decreases. Accordingly, the current detection device 106 of the second example is preferable than the current detection device 104 of the first example as an arrangement of the current measuring conductor 10 of the V-phase.

Figure 23:
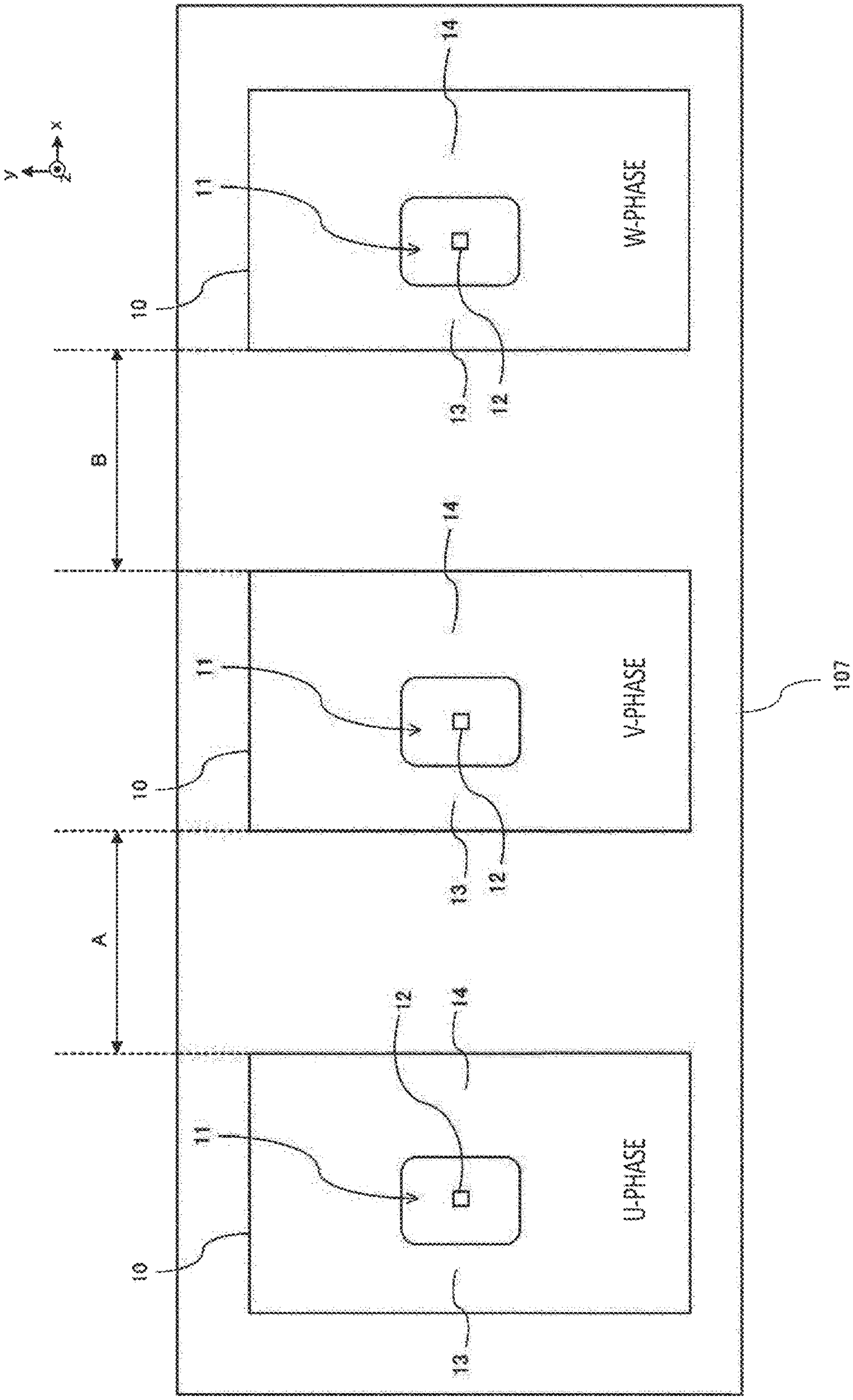
FIG. 23 is a top view illustrating a schematic configuration of a current detection device 107 in a comparative example of the second embodiment.

FIG. 23 is a top view illustrating a schematic configuration of a current detection device 107 in a comparative example of the second embodiment. As shown in FIG. 23, the current detection device 107 of the comparative example includes three current measuring conductors 10. All of the three current measuring conductors 10 are arranged such that current paths 13 with less widths are arranged on the left side, and current paths 14 with greater widths are arranged on the right side. That is, the three current measuring conductors 10 are arranged so as to face a same orientation. A distance A between the current measuring conductor 10 on the left side and the current measuring conductor 10 at the center is the same as a distance B between the current measuring conductor 10 at the center and the current measuring conductor 10 on the right side (A=B). Each of the three current measuring conductors 10 corresponds to a U-phase, a V-phase, and a W-phase in three-phase alternating current, and alternating current flowing in the three current measuring conductors 10 is configured to have a phase different by 120 degrees, respectively.

Figure 24:
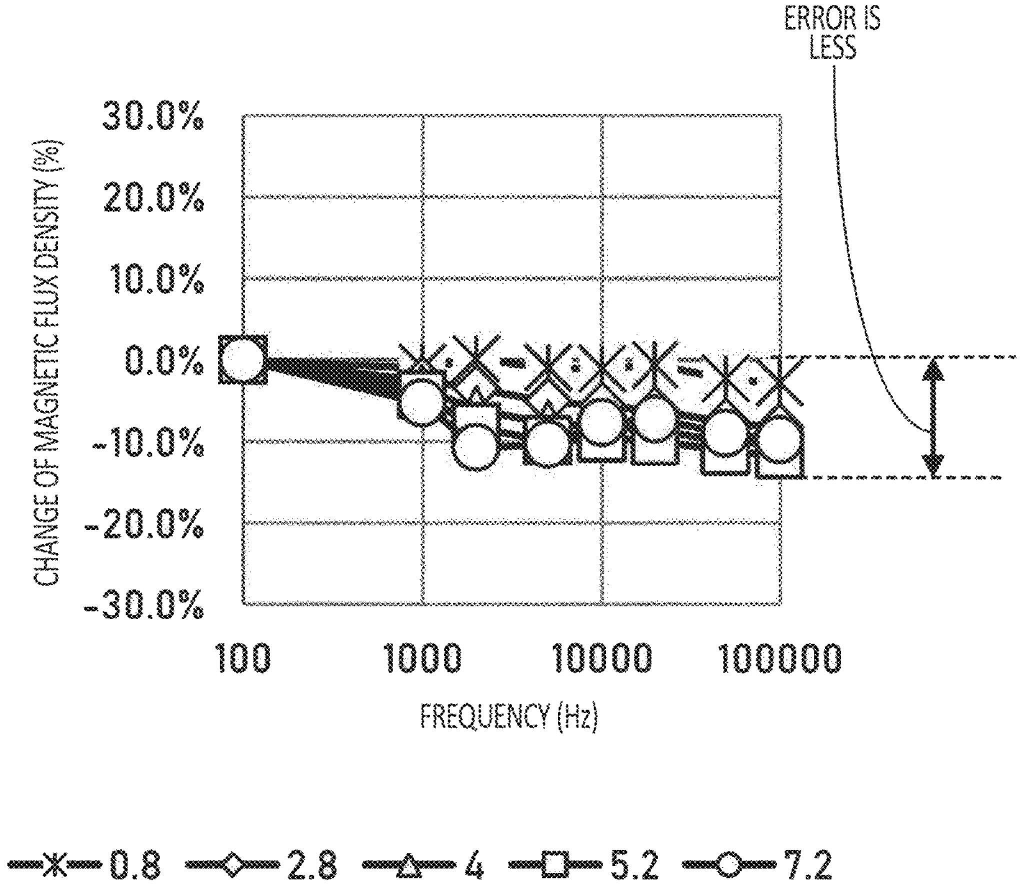
FIG. 24 is a graph illustrating a performance of the current detection device 107 of the comparative example of the second embodiment.
Figure 25:
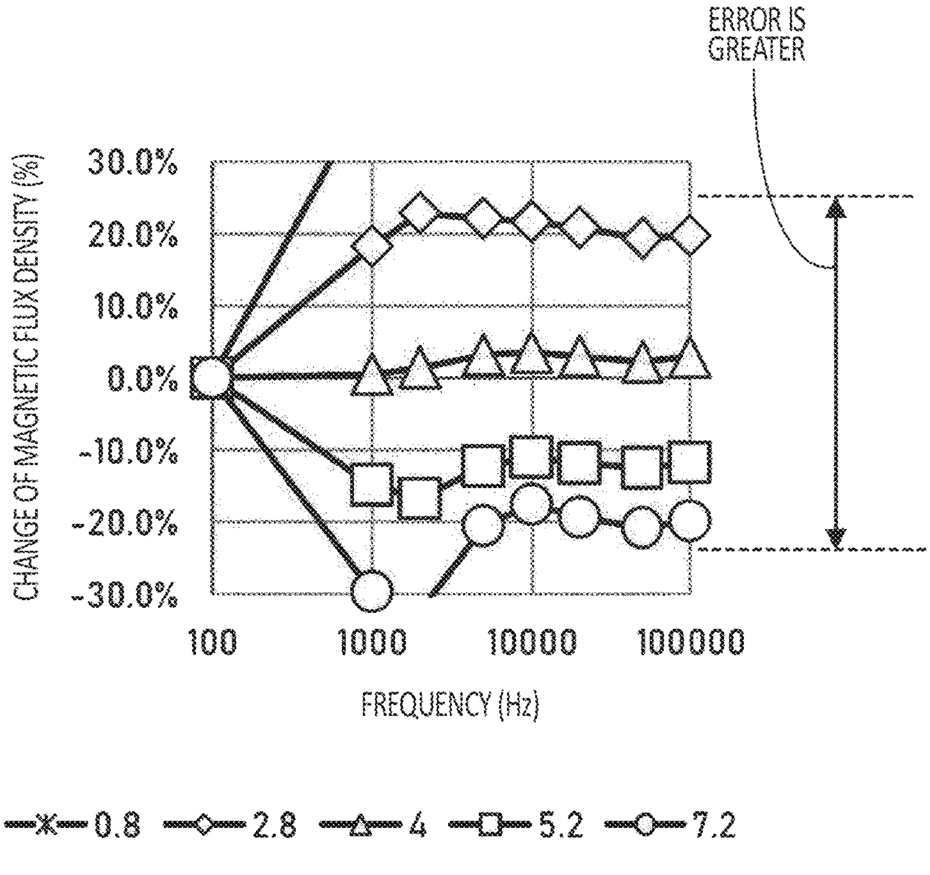
FIG. 25 is a graph illustrating a performance of the current detection device 107 of the comparative example of the second embodiment.
Figure 26:
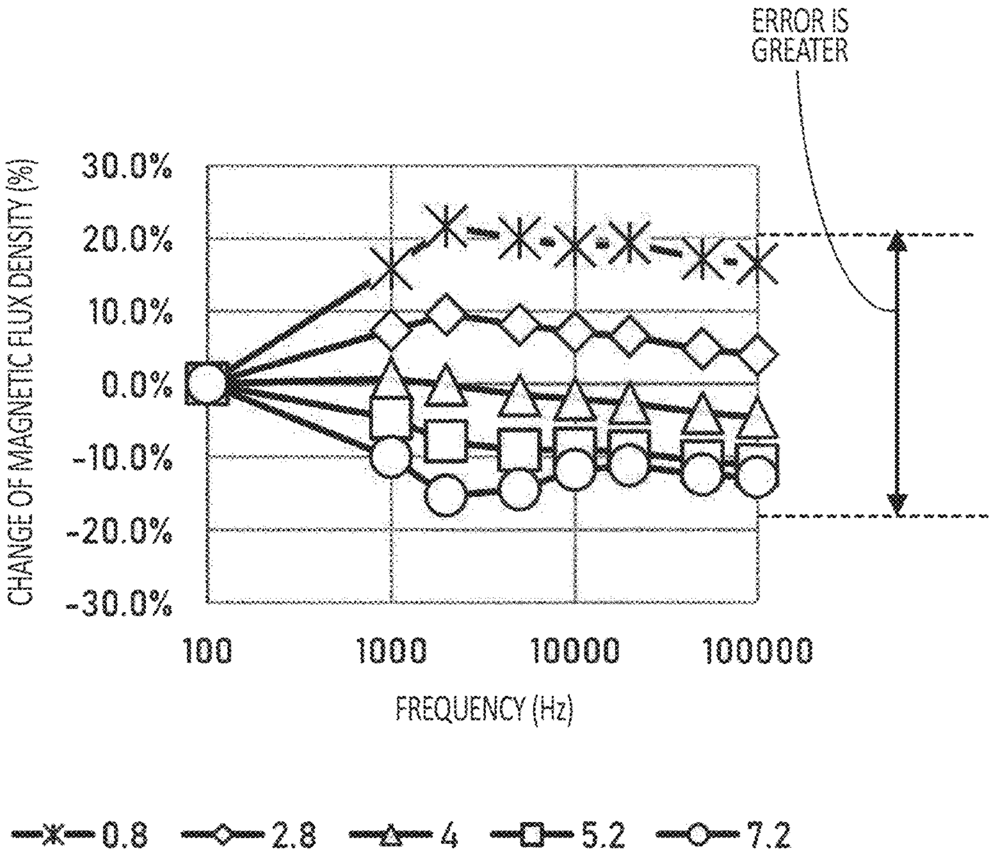
FIG. 26 is a graph illustrating a performance of the current detection device 107 of the comparative example of the second embodiment.

FIG. 24 to FIG. 26 are graphs illustrating performances of the current detection device 107 of the comparative example. FIG. 24 indicates a rate of change due to a frequency of the magnetic flux density detected by magnetic detection elements 12 of a current measuring conductor 10 on the left side of the current detection device 107 of the comparative example, FIG. 25 indicates a rate of change due to a frequency of the magnetic flux density detected by magnetic detection elements 12 of a current measuring conductor 10 at the center of the current detection device 107 of the comparative example, and FIG. 26 indicates a rate of change due to a frequency of the magnetic flux density detected by magnetic detection elements 12 of a current measuring conductor 10 on the right side of the current detection device 107 of the comparative example.

Each of vertical axes in FIG. 24 to FIG. 26 indicates a rate of change (%) in a magnetic flux density with reference to a case in which a frequency of the alternating current flowing in the current measuring conductors 10 is 100 Hz, and each of the horizontal axes indicates the frequency. FIG. 24 to FIG. 26 illustrate a rate of change (%) in the magnetic flux density detected by the magnetic detection elements 12 when the position of each of the magnetic detection elements 12 is shifted in the x direction at a predetermined interval along the arrow A in FIG. 2.

The lines connected at white circle points in FIG. 24 to FIG. 26 indicate cases in which a distance between a left end of the gap 11 and the magnetic detection elements 12 is 7.2 mm, the lines connected at square points indicate cases in which the distance between the left end of the gap 11 and the magnetic detection elements 12 is 5.2 mm, the lines connected at triangle points indicate cases in which the distance between the left end of the gap 11 and the magnetic detection elements 12 is 4.0 mm, the lines connected at rhomboidal points indicate cases in which the distance between the left end of the gap 11 and the magnetic detection elements 12 is 2.8 mm, and the lines connected at asterisk points indicate cases in which the distance between the left end of the gap 11 and the magnetic detection elements 12 is 0.8 mm.

As shown in FIG. 24 to FIG. 26, while a detection error of the magnetic flux density of the magnetic detection elements 12 of the current measuring conductor 10 on the left side of the current detection device 107 of the comparative example is small, a detection error of the magnetic flux density detected by the magnetic detection element 12 of the current measuring conductor 10 at the center and the magnetic detection element 12 of the current measuring conductor 10 on the right side is a large numerical value.

Effects of Second Embodiment

According to the current detection device 104 of the first example in the second embodiment, the current detection device 104 includes three current measuring conductors 10, and two current measuring conductors 10 among the three current measuring conductors 10 arranged outward are arranged side by side in the x direction such that current paths 14 with greater widths face each other. In this way, an error of the magnetic flux density detected by the magnetic detection elements 12 in a case in which the position of implementation of the magnetic detection elements 12 is shifted can be reduced, and the performance due to the shifting of the position to implement the magnetic detection elements 12 can be prevented from decreasing.

According to the current detection device 106 of the second example in the second embodiment, the current detection device 106 includes three current measuring conductors 10, and the current measuring conductor 10 of the V-phase at the center is arranged to approach the current measuring conductor 10 of the W-phase on the right side. In this way, an error of the magnetic flux density detected by the magnetic detection elements 12 in a case in which the position of implementation of the magnetic detection elements 12 is shifted can be reduced, and the performance due to the shifting of the position to implement the magnetic detection elements 12 can be prevented from decreasing.

First Example of Third Embodiment

Figure 27:
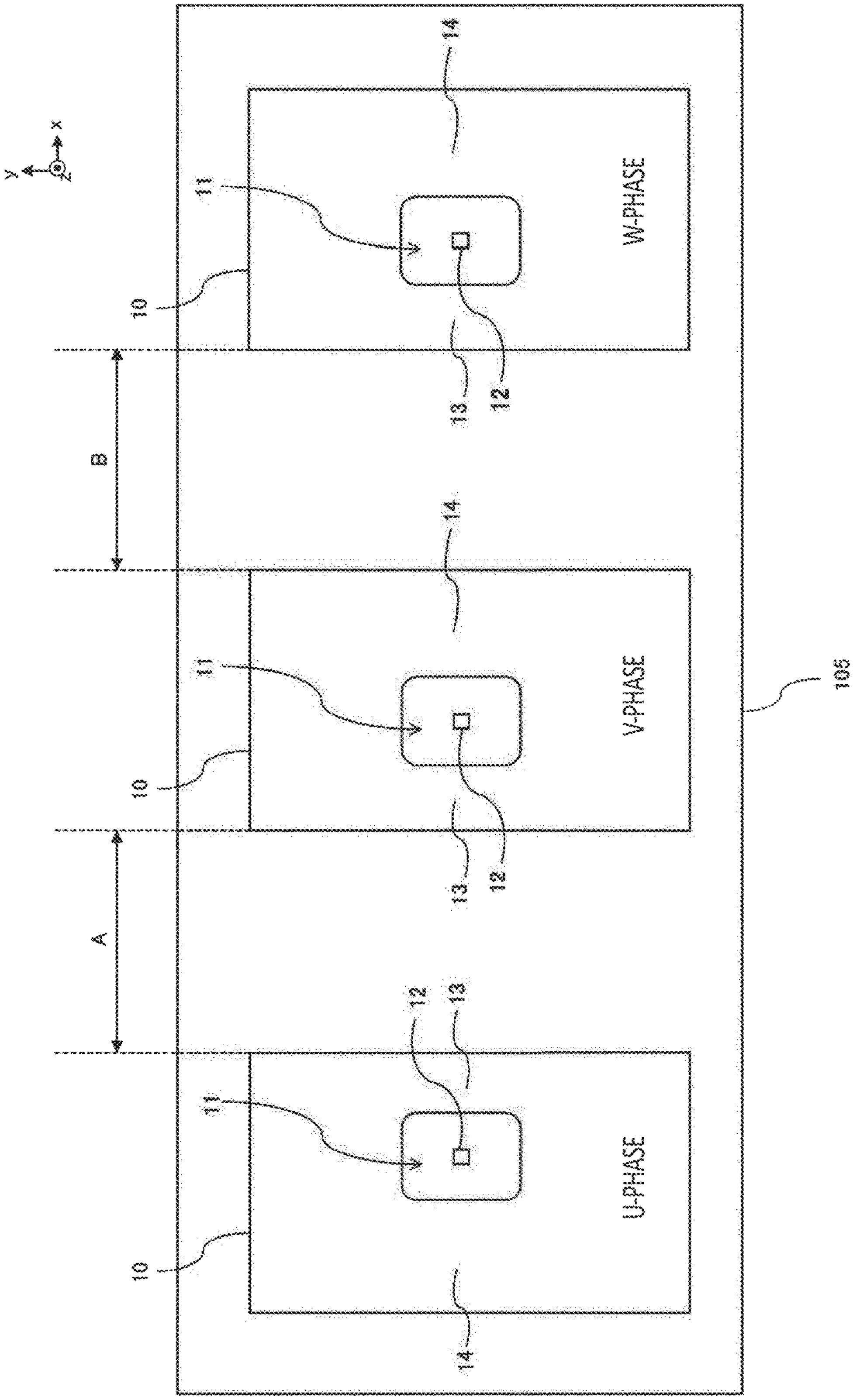
FIG. 27 is a top view illustrating a schematic configuration of a current detection device 105 in a first example of a third embodiment.

FIG. 27 is a top view illustrating a schematic configuration of a current detection device 105 in a first example of a third embodiment. As shown in FIG. 27, the current detection device 105 of the first example of the third embodiment includes three current measuring conductors 10. Two current measuring conductors 10 among the three current measuring conductors 10 arranged outward are arranged side by side in the x direction such that current paths 13 with less widths face each other. Two current measuring conductors 10 arranged at the center among the three current measuring conductors 10 are arranged such that a current path 14 with greater width is on the right side. A distance A between the current measuring conductor 10 on the left side and the current measuring conductor 10 at the center is arranged to be the same as a distance B between the current measuring conductor 10 at the center and the current measuring conductor 10 on the right side (A=B).

Figure 28:
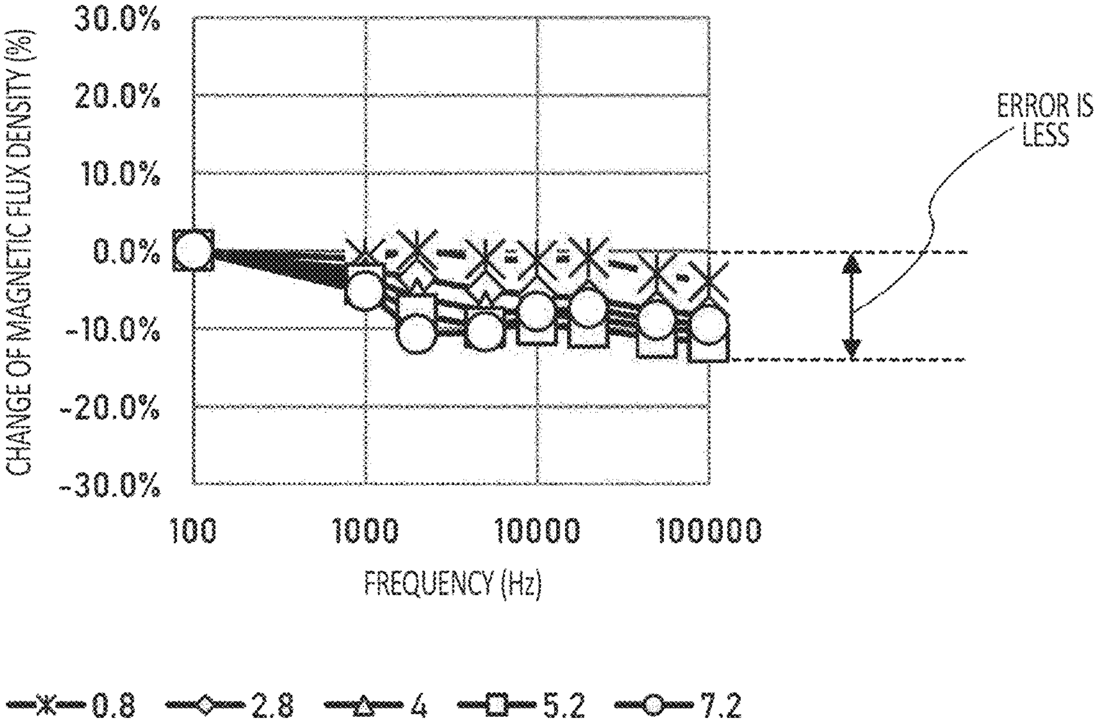
FIG. 28 is a graph indicating a comparison between performances of the current detection device 104 in the first example of the second embodiment and the current detection device 105 of a first example of the third embodiment.

FIG. 28 to FIG. 31 are graphs indicating comparisons of the performances of the current detection device 104 of the first example of the second embodiment and the current detection device 105 of the first example of the third embodiment in a case in which the alternating current flowing in the three current measuring conductors 10 is configured to have a phase different by 120 degrees, respectively. FIG. 28 indicates a rate of change due to a frequency of the magnetic flux density detected by magnetic detection elements 12 of a current measuring conductor 10 on the left side of the current detection device 104 of the first example of the second embodiment, and FIG. 29 indicates a rate of change due to a frequency of the magnetic flux density detected by magnetic detection elements 12 of a current measuring conductor 10 on the right side of the current detection device 104 of the first example of the second embodiment, FIG. 30 indicates a rate of change due to a frequency of the magnetic flux density detected by magnetic detection elements 12 of a current measuring conductor 10 on the left side of the current detection device 105 of the first example of the third embodiment, and FIG. 31 indicates a rate of change due to a frequency of the magnetic flux density detected by magnetic detection elements 12 of a current measuring conductor 10 on the right side of the current detection device 105 of the first example of the third embodiment.

Each of vertical axes in FIG. 28 to FIG. 31 indicates a rate of change (%) in a magnetic flux density with reference to a case in which a frequency of the alternating current flowing in the current measuring conductors 10 is 100 Hz, and each of the horizontal axes indicates the frequency. FIG. 28 to FIG. 31 illustrate a rate of change (%) in the magnetic flux density detected by the magnetic detection elements 12 when the position of each of the magnetic detection elements 12 is shifted in the x direction at a predetermined interval along the arrow A in FIG. 2.

The lines connected at white circle points in FIG. 28 to FIG. 31 indicate cases in which a distance between a left end of the gap 11 and the magnetic detection elements 12 is 7.2 mm, the lines connected at square points indicate cases in which the distance between the left end of the gap 11 and the magnetic detection elements 12 is 5.2 mm, the lines connected at triangle points indicate cases in which the distance between the left end of the gap 11 and the magnetic detection elements 12 is 4.0 mm, the lines connected at rhomboidal points indicate cases in which the distance between the left end of the gap 11 and the magnetic detection elements 12 is 2.8 mm, and the lines connected at asterisk points indicate cases in which the distance between the left end of the gap 11 and the magnetic detection elements 12 is 0.8 mm.

As shown in FIG. 28, in the current measuring conductor 10 on the left side of the current detection device 104 of the first example of the second embodiment, when the magnetic detection elements 12 are arranged at a position near the right end of the gap 11, the magnetic flux density detected by the magnetic detection elements 12 tends to gradually decrease depending on a frequency of alternating current flowing in the current measuring conductor 10. Similarly, when the magnetic detection elements 12 are arranged at the positions near a left end of the gap 11, a magnetic flux density detected by the magnetic detection elements 12 tends to further gradually decrease depending on the frequency of the alternating current flowing in the current measuring conductors 10.

Figure 29:
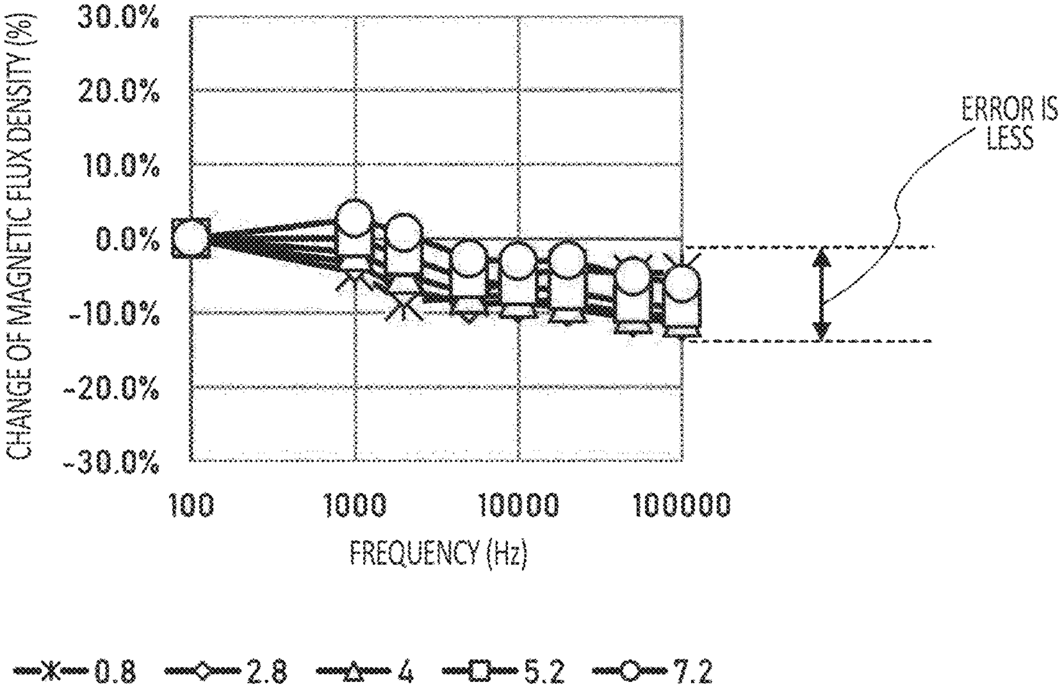
FIG. 29 is a graph indicating a comparison between performances of the current detection device 104 in the first example of the second embodiment and the current detection device 105 of the first example of the third embodiment.

As shown in FIG. 29, in the current measuring conductor 10 on the right side of the current detection device 104 of the first example of the second embodiment, when the magnetic detection elements 12 are arranged at a position near the right end of the gap 11, the magnetic flux density detected by the magnetic detection elements 12 tends to gradually decrease depending on a frequency of alternating current flowing in the current measuring conductor 10. Similarly, when the magnetic detection elements 12 are arranged at the positions near a left end of the gap 11, a magnetic flux density detected by the magnetic detection elements 12 tends to gradually decrease depending on the frequency of the alternating current flowing in the current measuring conductors 10.

Figure 30:
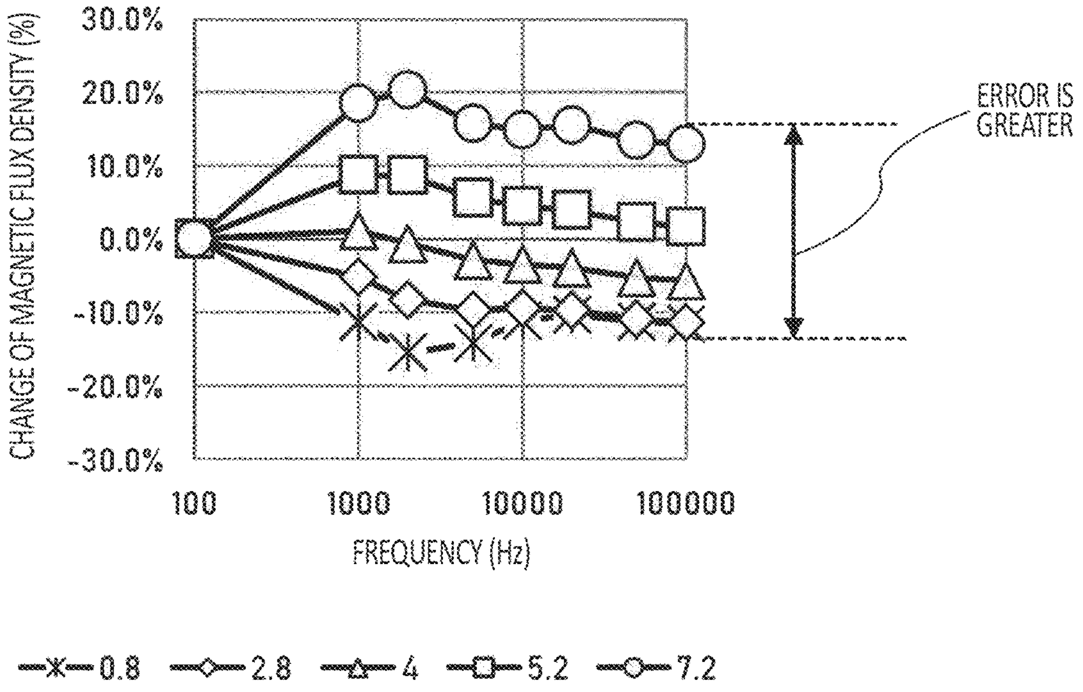
FIG. 30 is a graph indicating a comparison between performances of the current detection device 104 in the first example of the second embodiment and the current detection device 105 of the first example of the third embodiment.

As shown in FIG. 30, in the current measuring conductor 10 on the left side of the current detection device 105 of the first example of the third embodiment, when the magnetic detection elements 12 are arranged at a position near the right end of the gap 11, the magnetic flux density detected by the magnetic detection elements 12 tends to increase in a range of +15% to +20% depending on a frequency of alternating current flowing in the current measuring conductor 10. On the other hand, when the magnetic detection elements 12 are arranged at the positions near a left end of the gap 11, a magnetic flux density detected by the magnetic detection elements 12 tends to decrease in a range of −10% to −15% depending on the frequency of the alternating current flowing in the current measuring conductors 10.

Figure 31:
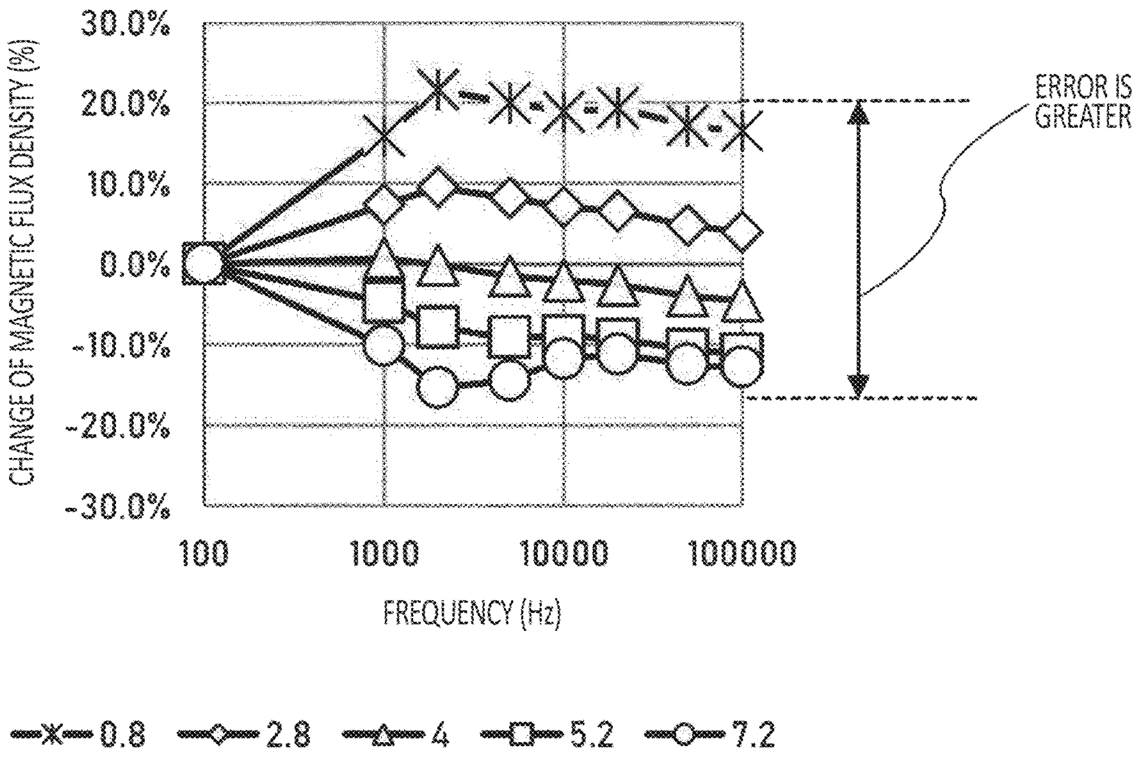
FIG. 31 is a graph indicating a comparison between performances of the current detection device 104 in the first example of the second embodiment and the current detection device 105 of the first example of the third embodiment.

As shown in FIG. 31, in the current measuring conductor 10 on the right side of the current detection device 105 of the first example of the third embodiment, when the magnetic detection elements 12 are arranged at a position near the right end of the gap 11, the magnetic flux density detected by the magnetic detection elements 12 tends to decrease in a range of −10% to −15% depending on a frequency of alternating current flowing in the current measuring conductor 10. On the other hand, when the magnetic detection elements 12 are arranged at the positions near a left end of the gap 11, a magnetic flux density detected by the magnetic detection elements 12 tends to increase in a range of +15% to +20% depending on the frequency of the alternating current flowing in the current measuring conductors 10.

As shown in FIG. 28 and FIG. 29, in the current detection device 104 of the first example of the second embodiment, a width of an error of the magnetic flux density detected by the magnetic detection elements 12 is small between the case in which the magnetic detection elements 12 are arranged in the positions near the right end of the gap 11 and the case in which the magnetic detection elements 12 are arranged in the positions near the left end of the gap 11. This indicates that an error of the magnetic flux density detected by the magnetic detection elements 12 is less when a position in which the magnetic detection elements 12 are implemented is shifted.

As shown in FIG. 30 and FIG. 31, in the current detection device 105 of the first example of the third embodiment, a width of an error of the magnetic flux density detected by the magnetic detection elements 12 is large between the case in which the magnetic detection elements 12 are arranged in the positions near the right end of the gap 11 and the case in which the magnetic detection elements 12 are arranged in the positions near the left end of the gap 11. This indicates that an error of the magnetic flux density detected by the magnetic detection elements 12 is greater when a position in which the magnetic detection elements 12 are implemented is shifted.

From the above, it can be learned that in a case in which the phase of the alternating current flowing in the three current measuring conductors 10 is different by 120 degrees, a detection error of a magnetic flux density due to shifting of the positions of the magnetic detection elements 12 is less in the current detection device 104 of the first example of the second embodiment than in the current detection device 105 of the first example of the third embodiment. Accordingly, in the perspective of the detection error of the magnetic flux density due to the shifting of the positions of the magnetic detection elements 12, it can be learned that a configuration of the current detection device 104 of the first example of the second embodiment is superior, in which the two current measuring conductors 10 arranged outward among the three current measuring conductors 10 are arranged side by side in the x direction such that the current paths 14 with greater widths face each other.

In the first example of the second embodiment, when a phase difference of alternating current between the adjacent current measuring conductors 10 is near 120 degrees, a distance A between the current measuring conductor 10 on the left side and the current measuring conductor 10 at the center is preferably arranged to be greater than a distance B between the current measuring conductor 10 at the center and the current measuring conductor 10 on the right side. It can be inferred that this is derived from an effect that is similar to that of the first embodiment being generated when considering the current measuring conductor 10 at the center and the current measuring conductor 10 on the right side. Accordingly, the arrangement of the second embodiment is preferably used when the phase difference of the alternating current between the adjacent current measuring conductors 10 is 120 degrees.

Accordingly, in the first example of the second embodiment, each of the three current measuring conductors 10 corresponds to a U-phase, a V-phase, and a W-phase in three-phase alternating current, and alternating current flowing in the three current measuring conductors 10 may be configured to have a phase different by 120 degrees, respectively.

On the other hand, in the first example of the third embodiment, when a phase of alternating current between the adjacent current measuring conductors 10 is in a range of 0 degree to 80 degrees, a distance A between the current measuring conductor 10 on the left side and the current measuring conductor 10 at the center is preferably arranged to be less than a distance B between the current measuring conductor 10 at the center and the current measuring conductor 10 on the right side. It can be inferred that this is derived from an effect that is similar to that of the reference example being generated when considering the current measuring conductor 10 at the center and the current measuring conductor 10 on the left side.

Accordingly, in the first example of third embodiment, the phase difference of the alternating current between the adjacent current measuring conductors 10 is preferably used in a range of 0 degree to 80 degrees.

In addition, the arrangement of second embodiment and the third embodiment may be applied on any adjacent three current measuring conductors 10 in a case in which four or more current measuring conductors 10 are arranged, not limited to a case in which three current measuring conductors 10 are arranged, that is, in a case of three-phase alternating current due to three current measuring conductors 10.

Second Example of Third Embodiment

Figure 32:
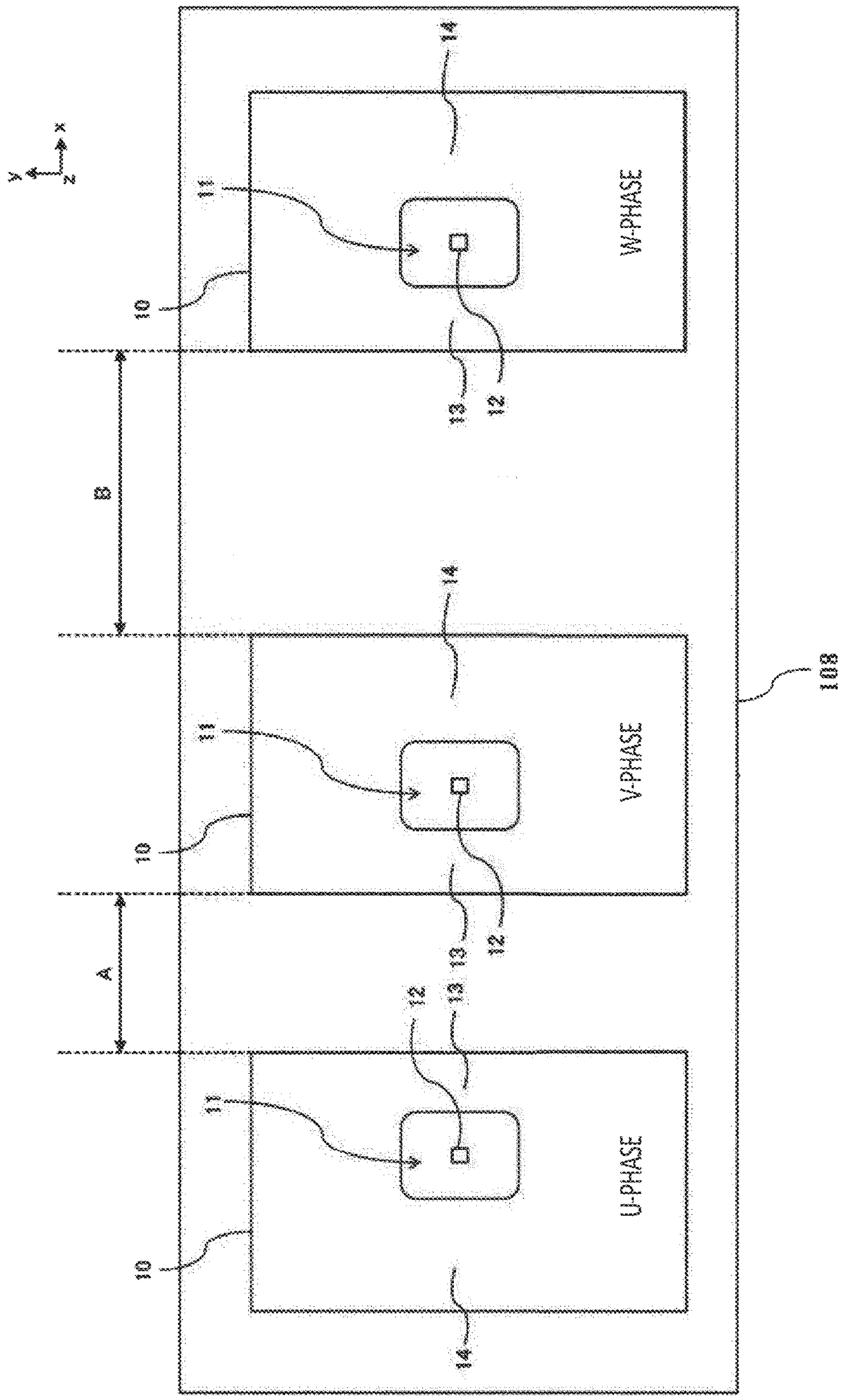
FIG. 32 is a top view illustrating a schematic configuration of a current detection device 108 in a second example of the third embodiment.

FIG. 32 is a top view illustrating a schematic configuration of a current detection device 108 in a second example of the third embodiment. As shown in FIG. 32, the current detection device 108 includes three current measuring conductors 10. Two current measuring conductors 10 among the three current measuring conductors 10 arranged outward are arranged side by side in the x direction such that current paths 13 with less widths face each other. A current measuring conductor 10 arranged at the center among the three current measuring conductors 10 is arranged such that a current path 13 with less width is on the left side. A distance A between the current measuring conductor 10 on the left side and the current measuring conductor 10 at the center is arranged to be less than a distance B between the current measuring conductor 10 at the center and the current measuring conductor 10 on the right side.

Effects of Third Embodiment

According to the current detection device 105 of the first example in the third embodiment indicated in FIG. 27, the current detection device 105 includes three current measuring conductors 10, and two current measuring conductors 10 among the three current measuring conductors 10 arranged outward are arranged side by side in the x direction such the current paths 13 with less widths face each other. In this way, when the phase difference of the alternating current between the adjacent current measuring conductors 10 is in a range of 0 degree to 80 degrees, an error of the magnetic flux density detected by the magnetic detection elements 12 in a case in which the position of implementation of the magnetic detection elements 12 is shifted can be reduced, and the performance due to the shifting of the position to implement the magnetic detection elements 12 can be prevented from decreasing.

According to the current detection device 108 of the second example in the third embodiment indicated in FIG. 32, the current detection device 108 includes three current measuring conductors 10, and the current measuring conductor 10 of the V-phase at the center is arranged to approach the current measuring conductor 10 of the U-phase on the left side. In this way, when the phase difference of the alternating current between the adjacent current measuring conductors 10 is in a range of 0 degree to 80 degrees, an error of the magnetic flux density detected by the magnetic detection elements 12 in a case in which the position of implementation of the magnetic detection elements 12 is shifted can be reduced, and the performance due to the shifting of the position to implement the magnetic detection elements 12 can be prevented from decreasing.

Another Embodiment 1

Figure 33:
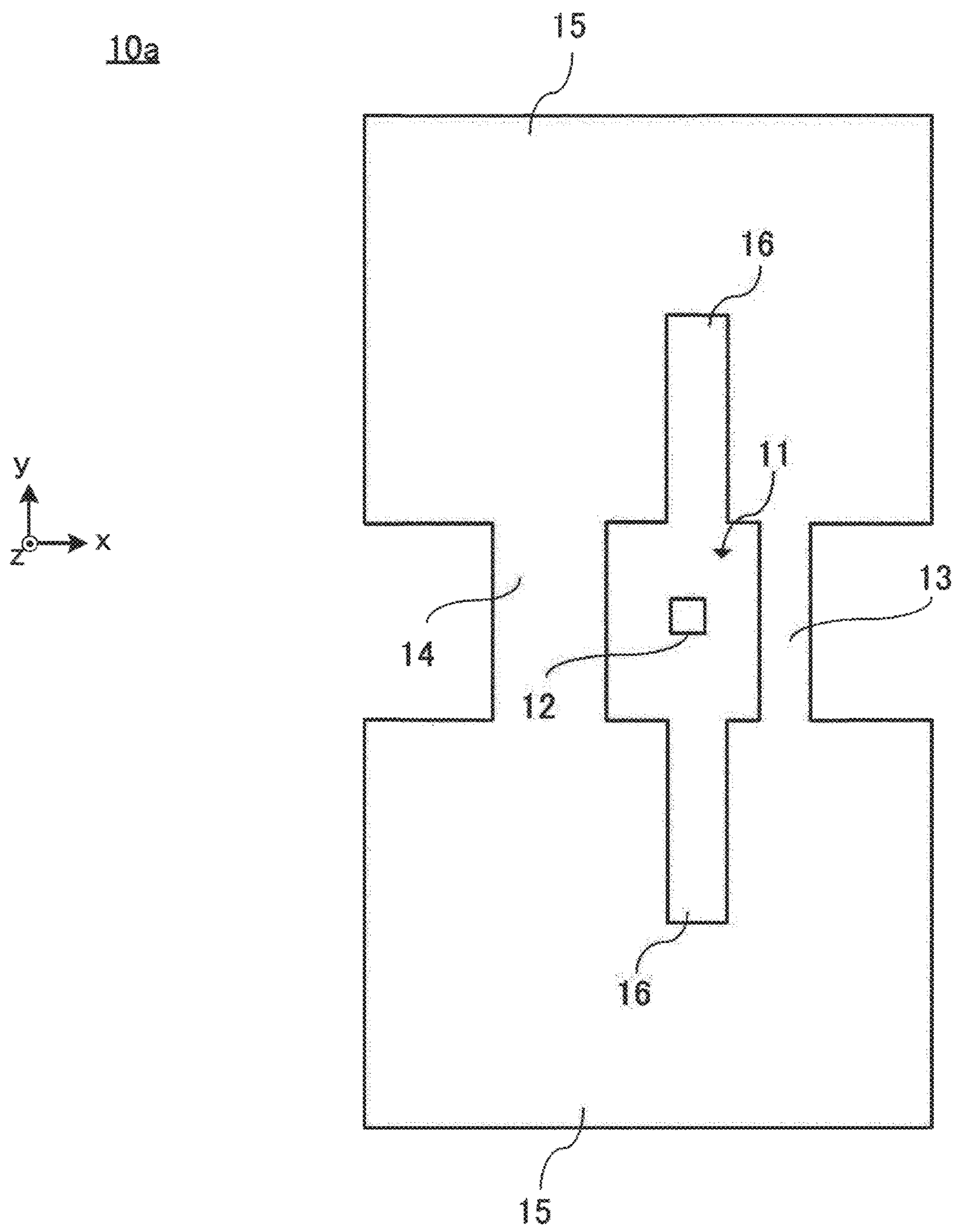
FIG. 33 is a top view illustrating of a schematic configuration of a current measuring conductor **10*a*** in another embodiment 1.

FIG. 33 is a top view illustrating of a schematic configuration of a current measuring conductor 10*a* in another embodiment 1. The current measuring conductor 10*a* in another embodiment 1 includes a gap 11, a magnetic detection element 12, a current path 13 with less width, a current path 14 with greater width, two main body portions 15, and a slit 16. The magnetic detection element 12 is supported by being fixed on a substrate. The substrate is inserted in the slit 16, and fixed on the current measuring conductor 10*a*. The two current paths 13 and 14 are respectively disposed closer to an inner side than an outer edge of the two main body portions 15 in a direction in which the two current paths 13 and 14 are arranged side by side. Instead of the current measuring conductor 10 in the above-described first embodiment, the current measuring conductor 10*a* in another embodiment 1 may be used.

Another Embodiment 2

Figure 34:
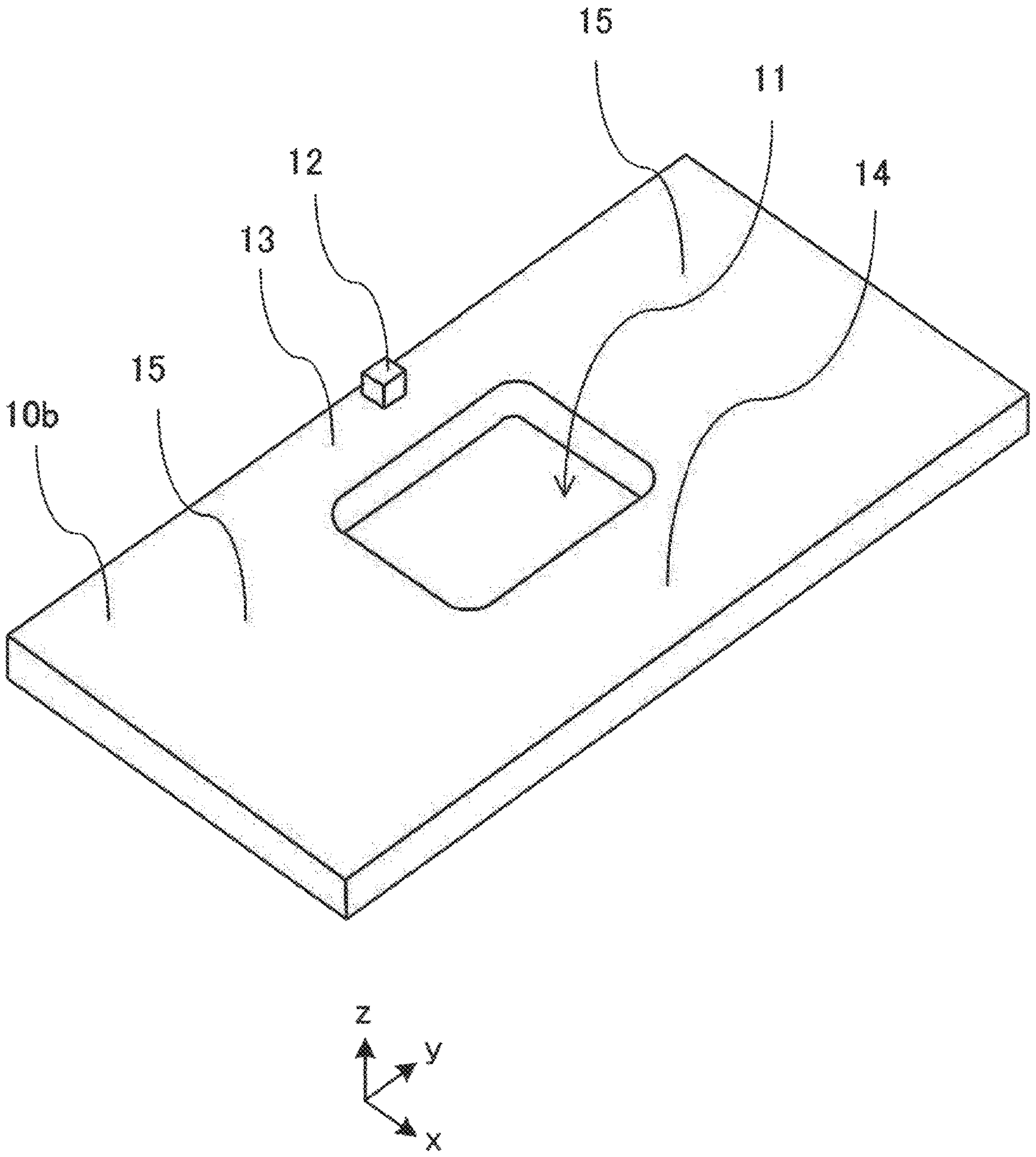
FIG. 34 is a perspective view illustrating a schematic configuration of a current measuring conductor **10*b*** in another embodiment 2.
Figure 35:
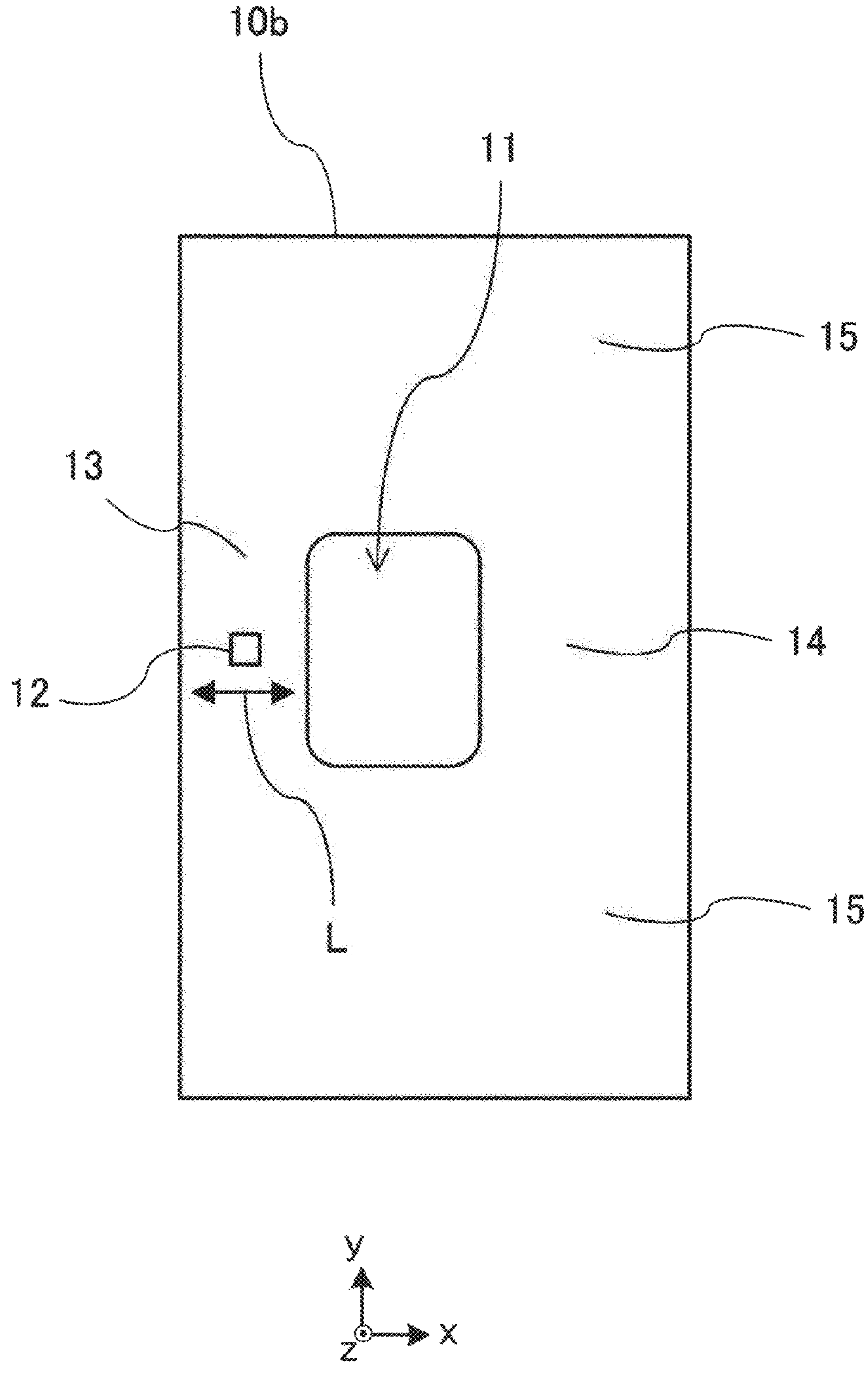
FIG. 35 is a top view illustrating an example of the schematic configuration of the current measuring conductor 10*b* in another embodiment 2.
Figure 36:
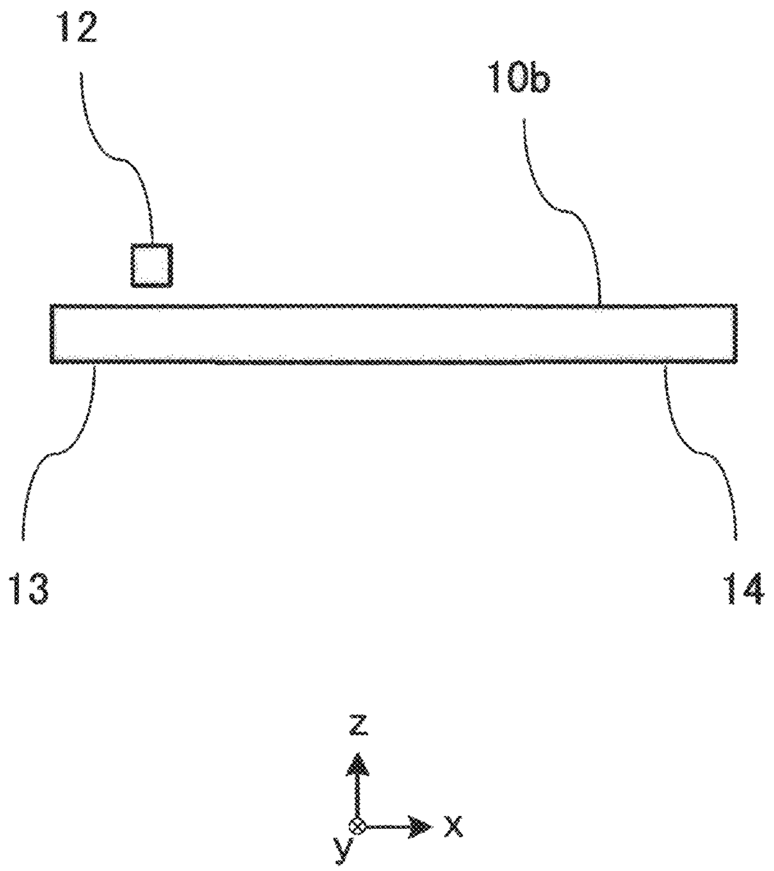
FIG. 36 is a side view illustrating an example of the schematic configuration of the current measuring conductor 10*b* in another embodiment 2.

FIG. 34 is a perspective view illustrating a schematic configuration of a current measuring conductor 10*b* in another embodiment 2. FIG. 35 is a top view illustrating an example of the schematic configuration of the current measuring conductor 10*b* in another embodiment 2. FIG. 36 is a side view illustrating an example of the schematic configuration of the current measuring conductor 10*b* in another embodiment 2. In the above-described first embodiment, the magnetic detection element 12 is arranged inside the gap 11 in a top view, as shown in FIG. 2. However, the magnetic detection element 12 may be arranged on a top portion or a bottom portion of the current path 13 with less width. As shown in FIG. 34 to FIG. 36, in the current measuring conductor 10*b* in another embodiment 2, the magnetic detection element 12 is arranged on a top portion of the current path 13 with less width. An arrow L illustrated in FIG. 35 indicates a range of a shift of a position to implement the magnetic detection elements 12 in the current measuring conductor 10*b*. As shown in FIG. 35, the magnetic detection elements 12 may be implemented in a state in which the position is shifted in the x direction by a width of the arrow L. In this manner, in the current measuring conductor 10 and the like, the magnetic detection element 12 may be arranged so as to overlap with the current path 13 with less width in a top view, may be arranged so as to overlap with the current path 14 with greater width in a top view, may be arranged so as to overlap with the gap 11 between the current path 14 with greater width and the current path 13 with less width in a top view, may be arranged on a side of the current path 14 with greater width in a top view, and may be arranged on a side of the current path 13 with less width in a top view.

Figure 37:
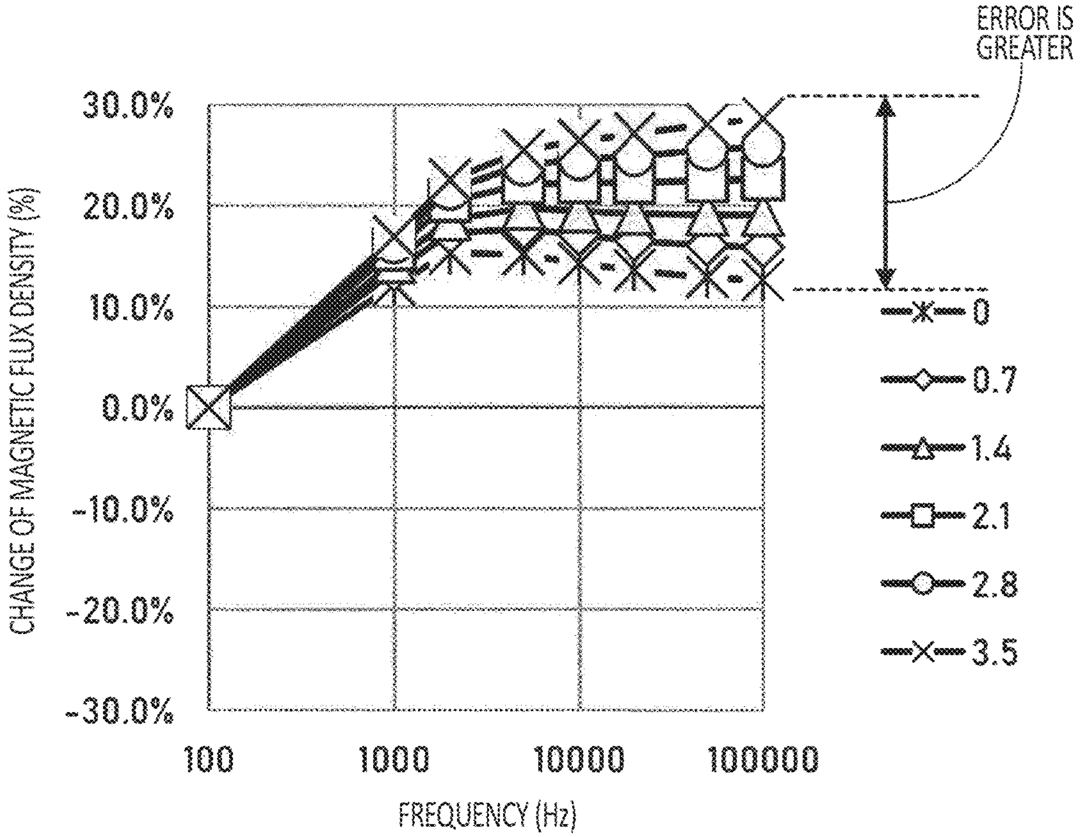
FIG. 37 is a graph indicating a comparison between performances of a current detection device 101 of a reference example and a current detection device 102 of a first embodiment in a case in which the current measuring conductor 10*b* in another embodiment 2 is used.
Figure 38:
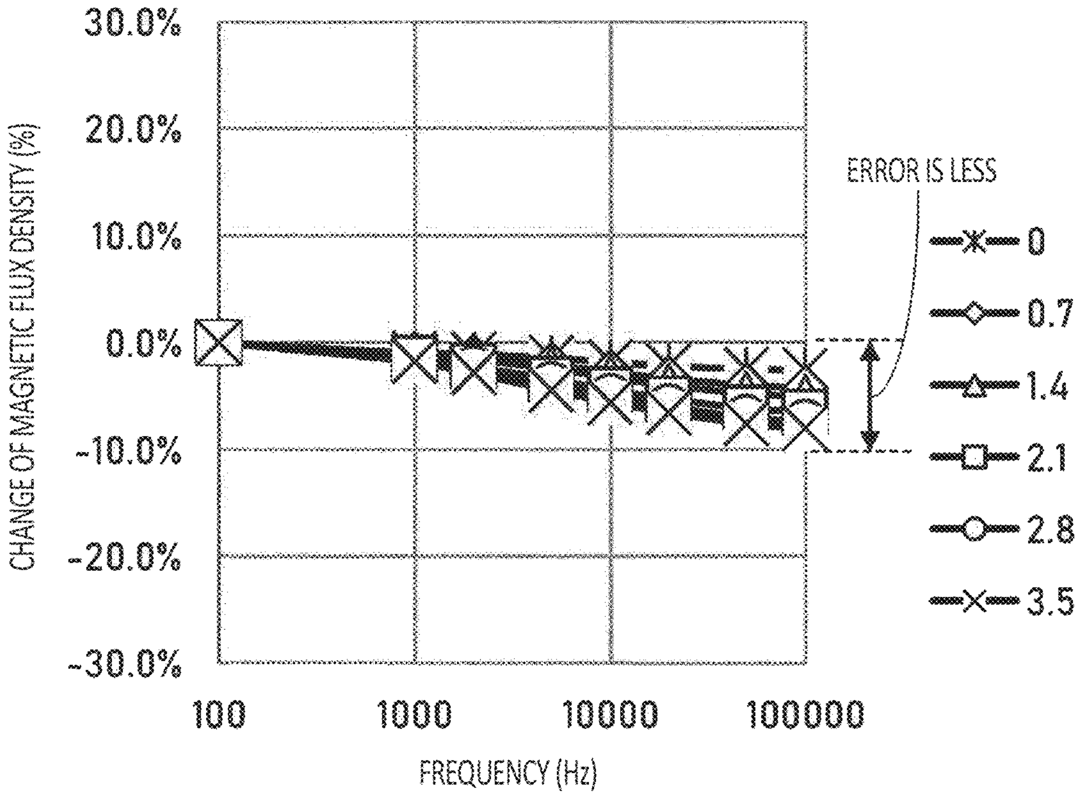
FIG. 38 is a graph indicating a comparison between performances of a current detection device 101 of a reference example and a current detection device 102 of a first embodiment in a case in which the current measuring conductor 10*b* in another embodiment 2 is used.

FIG. 37 and FIG. 38 are graphs indicating a comparison between performances of a current detection device 101 of a first example and a current detection device 102 of a second example in a case in which the current measuring conductor 10*b* in another embodiment 2 is used. FIG. 37 and FIG. 38 illustrate a change due to a frequency of a magnetic flux density detected by each of the magnetic detection elements 12 in a case in which phases of the alternating currents flowing in two current measuring conductors 10*b* are shifted from each other by 180 degrees. FIG. 37 and FIG. 38 illustrate a magnetic flux density detected by the magnetic detection elements 12 when the position of each of the magnetic detection elements 12 is shifted in the x direction at a predetermined interval along the arrow L in FIG. 35.

Each of vertical axes in FIG. 37 and FIG. 38 indicates a rate of change (%) in a magnetic flux density with reference to a case in which a frequency of the alternating current flowing in the current measuring conductor 10*b* is 100 Hz, and each of the horizontal axes indicates the frequency. FIG. 37 indicates a magnetic flux density detected by the magnetic detection elements 12 of the current measuring conductor 10 on the left side of the current detection device 101 of the first example, and FIG. 38 indicates a magnetic flux density detected by the magnetic detection elements 12 of the current measuring conductor 10 on the left side of the current detection device 102 of the second example.

The lines connected at cross points in FIG. 37 and FIG. 38 indicate cases in which a distance between a left end of the current path 13 and the magnetic detection element 12 is 3.5 mm, the lines connected at white circle points indicate cases in which the distance between the left end of the current path 13 and the magnetic detection element 12 is 2.8 mm, the lines connected at square points indicate cases in which the distance between the left end of the current path 13 and the magnetic detection element 12 is 2.1 mm, the lines connected at triangle points indicate cases in which the distance between the left end of the current path 13 and the magnetic detection element 12 is 1.4 mm, the lines connected at rhomboidal points indicate cases in which the distance between the left end of the current path 13 and the magnetic detection element 12 is 0.7 mm, and the lines connected at asterisk points indicate cases in which the distance between the left end of the current path 13 and the magnetic detection element 12 is 0 mm.

As shown in FIG. 37, in the current detection device 101 of the first example, a width of an error of the magnetic flux density detected by the magnetic detection element 12 is large between the case in which the magnetic detection elements 12 are arranged in the positions near the right end of the current path 13 and the case in which the magnetic detection elements 12 are arranged in the positions near the left end of the current path 13. This indicates that an error of the magnetic flux density detected by the magnetic detection elements 12 is greater when a position in which the magnetic detection elements 12 are implemented is shifted.

As shown in FIG. 38, in the current detection device 102 of the second example, a width of an error of the magnetic flux density detected by the magnetic detection element 12 is small between the case in which the magnetic detection elements 12 are arranged in the positions near the right end of the gap 11 and the case in which the magnetic detection elements 12 are arranged in the positions near the left end of the gap 11. This indicates that an error of the magnetic flux density detected by the magnetic detection element 12 is less when a position in which the magnetic detection elements 12 are implemented is shifted.

As described above, it can be learned that even in a case in which the current measuring conductor 10*b* in another embodiment 2 is used instead of the current measuring conductor 10 in the first embodiment, when the phases of the alternating currents flowing in the two current measuring conductors 10 are shifted from each other by 180 degrees, a detection error of a magnetic flux density due to shifting of the position of the magnetic detection element 12 is less in a case in which the current detection device 102 of the second example in which the two current measuring conductors 10 are arranged side by side in the x direction such that the current paths 14 with greater widths face each other is adopted. Accordingly, it can be learned that a law similar to that of the above-described first embodiment holds true.

Another Embodiment 3

In the above-described first and second embodiment, the two current paths 13 and 14 had a same thickness and different widths. However, the two current paths 13 and 14 are only required to have different cross-sectional areas to each other, for example, may have same widths and different thicknesses. In this case, the thickness of the current path 14 may be greater than the thickness of the current path 13. In addition, the two current paths 13 and 14 may also have different widths and different thicknesses. In this case, the width of the current path 14 may be greater than the width of the current path 13, and the thickness of the current path 14 may be greater than the thickness of the current path 13. In addition, in the above-described first and second embodiment, the two or three current measuring conductors 10 have a same shape. However, different shapes may be adopted. In addition, in each of the plurality of other embodiments described above, the current measuring conductor 10*a* and the like is described to have one magnetic detection element 12, however, instead of this, the current measuring conductor 10*a* and the like may have two or more magnetic detection elements 12 that are aligned in the x axis direction.

While the present invention has been described by way of the embodiments, the technical scope of the present invention is not limited to the above-described embodiments. It is apparent to persons skilled in the art that various alterations or improvements can be made to the above-described embodiments. It is also apparent from the description of the claims that the form to which such alterations or improvements are made can be included in the technical scope of the present invention.

It should be noted that the operations, procedures, steps, stages, and the like of each process performed by an apparatus, system, program, and method shown in the claims, the specification, or the drawings can be realized in any order as long as the order is not indicated by “prior to,” “before,” or the like and as long as the output from a previous process is not used in a later process. Even if the operation flow is described by using phrases such as “first” or “next” for the sake of convenience in the claims, specification, and drawings, it does not necessarily mean that the process must be performed in this order.

EXPLANATION OF REFERENCES

10, 10*a*, 10*b*: current measuring conductor;
11: gap;
12: magnetic detection element;
13: current path;
14: current path;
15: main body portion;
16: slit;
101-108: current detection device.

What is claimed is:

1. A current detection device, comprising at least two bus bars each of which includes a magnetic detection element, a first current path having a larger cross-sectional area, and a second current path having a smaller cross-sectional area, the first current path and the second current path being arranged facing each other and sandwiching the magnetic detection element between the first current path and the second current path, wherein the at least two bus bars are arranged such that the first current paths face each other, and wherein in each of the at least two bus bars, to-be-measured current flows through the first current path and the second current path in a same direction, a first magnetic field is generated by the to-be-measured current flowing through the first current path, and a second magnetic field is generated by the to-be-measured current flowing through the second current path, and the first current path and the second current path are arranged to sandwich the magnetic detection element such that the first magnetic field and the second magnetic field penetrate through a magnetosensitive surface of the magnetic detection element.

2. The current detection device according to claim 1, further comprising another bus bar that is arranged between the at least two bus bars, and includes a magnetic detection element, a third current path having a larger cross-sectional area, and a fourth current path having a smaller cross-sectional area, the third current path and the fourth current path sandwiching the magnetic detection element.

3. A current detection device, comprising at least three bus bars each of which includes a magnetic detection element, a first current path having a larger cross-sectional area, and a second current path having a smaller cross-sectional area, the first current path and the second current path sandwiching the magnetic detection element, wherein one bus bar among the at least three bus bars is arranged between two other bus bars among the at least three bus bars, and in each of the at least three bus bars, to-be-measured current flows through the first current path and the second current path in a same direction, a first magnetic field is generated by the to-be-measured current flowing through the first current path, and a second magnetic field is generated by the to-be-measured current flowing through the second current path, and the first current path and the second current path are arranged to sandwich the magnetic detection element such that the first magnetic field and the second magnetic field penetrate through a magnetosensitive surface of the magnetic detection element.

4. The current detection device according to claim 3, wherein the one bus bar is arranged such that the first current path of the one bus bar and the first current path of one of the two other bus bars face each other and are separated each other by a first distance, which is defined as a minimum distance between facing edges thereof, the second current path of the one bus bar and the first current path of another one of the two other bus bars face each other and are separated each other by a second distance, which is defined as a minimum distance between facing edges thereof, and the second distance is greater than the first distance.

5. The current detection device according to claim 4, wherein the two other bus bars are arranged such that the first current paths face each other.

6. The current detection device according to claim 3, wherein the one bus bar is arranged such that the first current path of the one bus bar and the first current path of one of the two other bus bars face each other and are separated each other by a first distance, which is defined as a minimum distance between facing edges thereof, the second current path of the one bus bar and the first current path of another one of the two other bus bars face each other and are separated each other by a second distance, which is defined as a minimum distance between facing edges thereof, and the first distance is greater than the second distance.

7. The current detection device according to claim 6, wherein the two other bus bars are arranged such that the second current paths face each other.

8. The current detection device according to claim 1, wherein the first current path and the second current path have a same thickness and different widths.

9. The current detection device according to claim 2, wherein the first current path and the second current path have a same thickness and different widths.

10. The current detection device according to claim 1, wherein each of the at least two bus bars includes two main body portions to which the first current path and the second current path are coupled, and the first current path and the second current path are respectively disposed closer to an inner side than an outer edge of the two main body portions in a direction in which the first current path and the second current path are arranged side by side.

11. The current detection device according to claim 10, wherein each of the two main body portions includes a slit to which a substrate that supports the magnetic detection element is inserted.

12. A current detection device, comprising at least two bus bars each of which includes a magnetic detection element, a first current path having a larger cross-sectional area, a second current path having a smaller cross-sectional area, and two main body portions to which ends of the first current path and ends of the second current path are coupled, wherein in each of the at least two bus bars, the first current path and the second current path are arranged, between the two main body portions, in parallel with and spaced away from each other such that a gap is provided between the first current path and the second current path, and the at least two bus bars are arranged such that the first current paths face each other.

13. The current detection device according to claim 12, further comprising another bus bar that is arranged between the at least two bus bars, and includes a magnetic detection element, a third current path having a larger cross-sectional area, and a fourth current path having a smaller cross-sectional area.

14. A current detection device, comprising at least three bus bars each of which includes a magnetic detection element, a first current path having a larger cross-sectional area, a second current path having a smaller cross-sectional area, and two main body portions to which ends of the first current path and ends of the second current path are coupled, wherein one bus bar among the at least three bus bars is arranged between two other bus bars among the at least three bus bars, and in each of the at least three bus bars, the first current path and the second current path are arranged, between the two main body portions, in parallel with and spaced away from each other such that a gap is provided between the first current path and the second current path.

15. The current detection device according to claim 14, wherein the one bus bar is arranged such that the first current path of the one bus bar and the first current path of one of the two other bus bars face each other and are separated each other by a first distance, which is defined as a minimum distance between facing edges thereof, the second current path of the one bus bar and the first current path of another one of the two other bus bars face each other and are separated each other by a second distance, which is defined as a minimum distance between facing edges thereof, and the second distance is greater than the first distance.

16. The current detection device according to claim 15, wherein the two other bus bars are arranged such that the first current paths face each other.

17. The current detection device according to claim 14, wherein the one bus bar is arranged such that the first current path of the one bus bar and the first current path of one of the two other bus bars face each other and are separated each other by a first distance, which is defined as a minimum distance between facing edges thereof, the second current path of the one bus bar and the first current path of another one of the two other bus bars face each other and are separated each other by a second distance, which is defined as a minimum distance between facing edges thereof, and the first distance is greater than the second distance.

18. The current detection device according to claim 17, wherein the two other bus bars are arranged such that the second current paths face each other.

19. The current detection device according to claim 12, wherein in the at least two bus bars, the magnetic detection element is arranged so as to overlap with the second current path in a top view.

20. The current detection device according to claim 12, wherein in the at least two bus bars, the magnetic detection element is arranged so as to overlap with a gap between the first current path and the second current path in a top view.

21. The current detection device according to claim 14, wherein in the at least three bus bars, the magnetic detection element is arranged so as to overlap with the second current path in a top view.

* * * * *